(12) United States Patent
Maldonado et al.

(10) Patent No.: US 7,301,263 B2
(45) Date of Patent: Nov. 27, 2007

(54) MULTIPLE ELECTRON BEAM SYSTEM WITH ELECTRON TRANSMISSION GATES

(75) Inventors: Juan R. Maldonado, Palo Alto, CA (US); Steven T. Coyle, Alameda, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/856,111

(22) Filed: May 28, 2004

(65) Prior Publication Data

US 2005/0264148 A1    Dec. 1, 2005

(51) Int. Cl.
*H01J 43/00* (2006.01)
(52) U.S. Cl. .................. 313/103 R; 313/103 CM; 313/104
(58) Field of Classification Search ........... 313/542, 313/103 R, 543, 544, 103 CM, 104, 105 R, 313/105 CM
See application file for complete search history.

(56) References Cited

U.S. PATENT DOCUMENTS

| | | | |
|---|---|---|---|
| 3,575,629 A * | 4/1971 | O'Keeffe et al. ........... 313/524 |
| 3,594,583 A * | 7/1971 | Sheldon ................... 250/210 |
| 3,704,377 A | 11/1972 | Lehovec | |
| 3,733,492 A | 5/1973 | Hagar | |
| 3,815,969 A | 6/1974 | Fletcher et al. | |
| 3,867,662 A | 2/1975 | Endriz | |
| 3,989,971 A | 11/1976 | Santilli et al. | |
| 5,045,761 A | 9/1991 | Takahashi | |
| 5,122,663 A | 6/1992 | Chang et al. | |
| 5,146,077 A | 9/1992 | Caserta et al. | |
| 5,204,522 A | 4/1993 | Takahashi et al. | |
| 5,393,972 A | 2/1995 | Suyama et al. | |
| 5,424,549 A | 6/1995 | Feldman | |
| 5,471,051 A | 11/1995 | Niigaki et al. | |
| 5,684,360 A | 11/1997 | Baum et al. | |
| 5,751,109 A | 5/1998 | Payne | |
| 5,898,269 A * | 4/1999 | Baum et al. ................ 313/542 |

(Continued)

FOREIGN PATENT DOCUMENTS

WO    WO99/64911    12/1999

(Continued)

OTHER PUBLICATIONS

Garcia-Vidal, Martin-Moreno, Lezec, Ebbesen: Focusing light with a single subwavelength aperture flanked by surface corrugations; Applied Physics Lettters; Dec. 1, 2003; pp. 4500-4502; vol. 83, No. 22; American Institute of Physics; Melville, New York.

(Continued)

*Primary Examiner*—Joseph Williams
*Assistant Examiner*—Hana Asmat Sanei
(74) *Attorney, Agent, or Firm*—Janah & Associates, P.C.

(57) ABSTRACT

A multiple electron beam source comprises a photon source to generate a photon beam, a lens to focus the photon beam, a photocathode having a photon receiving surface and an electron emitting surface, and an array of electron transmission gates spaced apart from the electron emitting surface of the photocathode by a distance $d_g$. In one version, the multiple electron beam source comprises a photocathode stage assembly to move the photocathode relative to the array of electron transmission gates. In one version, the multiple electron beam source also comprises a plasmon-generating photon transmission plate comprising an array of photon transmission apertures and exterior surfaces capable of supporting plasmons.

40 Claims, 15 Drawing Sheets

U.S. PATENT DOCUMENTS

| | | |
|---|---|---|
| 5,912,500 A | 6/1999 | Costello et al. |
| 5,973,316 A | 10/1999 | Ebbesen et al. |
| 6,040,936 A | 3/2000 | Kim et al. |
| 6,081,365 A | 6/2000 | Kim |
| 6,166,854 A | 12/2000 | Katsuma |
| 6,167,016 A | 12/2000 | Block et al. |
| 6,220,914 B1 * | 4/2001 | Lee et al. .................... 455/24 |
| 6,236,033 B1 | 5/2001 | Ebbesen et al. |
| 6,285,020 B1 | 9/2001 | Kim et al. |
| 6,376,984 B1 | 4/2002 | Fernandez et al. |
| 6,376,985 B2 | 4/2002 | Lee et al. |
| 6,399,934 B1 | 6/2002 | Sullivan et al. |
| 6,429,443 B1 | 8/2002 | Mankos et al. |
| 6,476,401 B1 | 11/2002 | Veneklasen et al. |
| 6,501,783 B1 | 12/2002 | Capasso et al. |
| 6,515,292 B1 | 2/2003 | Scherer et al. |
| 6,525,328 B1 | 2/2003 | Miyoshi et al. |
| 6,538,256 B1 * | 3/2003 | Mankos et al. ........ 250/492.24 |
| 6,617,587 B2 | 9/2003 | Parker et al. |
| 6,630,681 B1 | 10/2003 | Kojima |
| 6,642,499 B1 * | 11/2003 | Boni et al. ............ 250/214 VT |
| 6,649,901 B2 | 11/2003 | Thio et al. |
| 6,670,772 B1 | 12/2003 | Arnold et al. |
| 2002/0036828 A1 | 3/2002 | Wong |
| 2003/0017579 A1 | 1/2003 | Corn et al. |
| 2003/0036204 A1 | 2/2003 | Stark et al. |
| 2003/0048427 A1 | 3/2003 | Fernandez et al. |
| 2003/0122091 A1 * | 7/2003 | Almogy ................ 250/492.24 |

FOREIGN PATENT DOCUMENTS

| | | |
|---|---|---|
| WO | WO 01/09915 A1 | 2/2001 |
| WO | WO 01/26134 A1 | 4/2001 |
| WO | WO 02/082494 A1 | 10/2002 |

OTHER PUBLICATIONS

Martin-Moreno, Garcia-Vidal, Lezec, Degiron, Ebbesen: Theory of highly directional emission from a single subwavelength aperture surrounded by surface corrugations; Physical Review Letters; Apr. 25, 2003; pp. 167401 (4); vol. 90, No. 16; American Physical Society; College Park, Maryland.

Garcia-Vidal, Lezec, Ebbesen, Martin-Moreno: Multiple paths to enhance optical transmission through a single subwavelength slit; Physical Review Letters; May 30, 2003; pp. 213901 (4); vol. 90, No. 21; American Physical Society; College Park, Maryland.

Yasuda, Arai, Kai, Ooae, Abe, Maruyama, Kiuchi: Multielectron beam blanking aperture array system SYNAPSE-2000; Journal of Vacuum Science and Technology; Nov./Dec. 1996; pp. 3813-3820; vol. 14, No. 6; American Vaccuum Society; New York, New York.

* cited by examiner (a) 300 nm aperture non-plasmon generating plate
(b) 300 nm aperture plasmon generating plate
(c) background noise level

MULTIPLE ELECTRON BEAM SYSTEM WITH ELECTRON TRANSMISSION GATES

GOVERNMENT SUPPORT

At least a portion of the work related to the invention described herein was performed with Government support under Contract Number N66001-99-C-8624. The Government has certain rights in these portions of the invention.

BACKGROUND

Embodiments of the present invention relate to electron beam sources that use photocathodes to generate electron beams.

Electron beam sources generate electron beams for applications such as scanning electron microscopy, defect detection, very large scale integration (VLSI) testing and electron beam lithography. In electron beam lithography, for example, a beam of electrons is directed onto an electron sensitive resist layer on a substrate to form a pattern therein. Electron beam lithography is used for making masks for optical lithography, and can also be used to form patterns directly on substrates such as semiconductor wafers and display panels.

In general, electron beam systems include an electron beam source to generate an electron beam and electron optics to shape and direct the beam. For example, one type of electron beam source can generate electrons by exposing a photocathode comprising a photoemissive material to a beam of photons. The incident photons excite electrons present in the photoemissive material, and if the energy transferred from the photons to the electrons is sufficiently greater than the electron emission energy of the photoemissive material, the electrons escape from the photocathode. Electrons escaping from the photocathode can form an electron beam which is then passed through electron optics which can collimate, shape, deflect and modulate the beam.

A single electron beam source can generate a single electron beam, for example, by having a single photon beam incident on a photocathode to generate the electron beam. However, a problem with single electron beam systems is that they have low throughput. To generate a pattern comprising a plurality of pixels, the beam needs to serially expose each pixel in the pattern. Patterns of increasingly higher complexity and resolution involve an increasingly greater number of pixels to be exposed, which can be undesirably time consuming when each pixel is exposed one at a time by the single electron beam.

Systems generating multiple electron beams have a higher throughput than single electron beam systems. One type of multiple electron beam source uses a photocathode that is patterned with electrically controllable electron transmission gates, as, for example, disclosed in U.S. Pat. No. 6,376,985 to Lee et al., which is incorporated herein by reference in its entirety. The gated photocathode of Lee et al. has a substrate on which there is a photoemitter material and a gate electrode. The gate electrode is insulated from the photoemitter material and surrounds an electron emission region of the photocathode. A voltage applied to the gate electrode controls transmission of electrons from the electron emission region. Lee et al. also discloses a gated photocathode having an array of gated emission regions. The gates define a plurality of individual electron beams. The spatial dimensions of the gates control the size and position of each electron beam.

However, gated photocathodes typically contain photoemissive materials that decrease in electron emission efficiency with operation. Thus, the photoyield, or the electron current generated per unit of incident photon power, of the gated photocathode decreases over time. A decreasing photoyield may require an increasing incident photon power, thus undesirably decreasing the energy efficiency of the multiple electron beam source. A decreasing photoyield may also require greater complexity in the control apparatus of the multiple electron beam source. For example, the multiple electron beam source may need a controller to monitor the decreasing photoyield and make necessary adjustments to ensure appropriate pattern exposure.

Another problem with gated photocathodes is that they are susceptible to peformance degradation resulting from nonuniformities or defects that may be present in the photocathode or other components of the multiple electron beam source. For example, the photocathode may contain a photoemissive layer with structural abnormalities, such as, for example, a nonuniform thickness. In another example, a photon source used to generate photon beams incident on the photocathode may generate beams that have a nonuniform intensity or have an intensity variation from beam to beam over the extent of incidence on the photocathode. Both of these examples may result in electron beams of decreased quality and interbeam precision, thus degrading the overall performance of the multiple electron beam source.

Another problem with multiple electron beam sources in general relates to the limits associated with transmission of photons. Photon beams have a transmission resolution limitation related to their wavelength. For example, transmitting photons through an aperture smaller than their wavelength decreases the photon transmission efficiency. However, in some applications it may be advantageous to excite a photocathode with photon beams of increasingly smaller cross-sections. For example, there is a demand in industry to form patterns with ever decreasing pixel size. When the pixel size becomes smaller than this photon wavelength limitation, the performance of the photon portion of a multiple electron beam source using a gated photocathode can be negatively impacted.

Thus, there is a need for a multiple electron beam source that does not have a decreasing usefulness over its lifetime. There is also a need for a multiple electron beam source with increased photon transmission efficiency, stability and uniformity.

SUMMARY

A multiple electron beam source comprises a photon source to generate a photon beam, a lens to focus the photon beam, a photocathode comprising a beam receiving surface to receive the photon beam focused by the lens and an electron emitting surface to emit electrons, and an array of electron transmission gates spaced apart from the electron emitting surface of the photocathode by a distance $d_g$. Each electron transmission gate comprises a membrane having opposing first and second surfaces, an anode on the first surface of the membrane, an insulator on the second surface of the membrane, an aperture through the anode, insulator and membrane, and a gate electrode on the insulator. The gate electrode is positioned about the aperture and capable of receiving a gate control voltage that controls the transmission and deflection of electrons emitted from the photocathode through that electron transmission gate. The gate electrode may also comprise gate electrode segments which are independently electrically addressable. In one version, the multiple electron beam source also comprises a stage assembly to move the photocathode relative to the array of electron transmission gates. In one embodiment, the photocathode stage assembly comprises a flexure, a piezoelectric actuator and a position sensor.

In one version, the multiple electron beam source comprises a plasmon-generating photon transmission plate capable of receiving the photon beam from a first lens. The plasmon-generating photon transmission plate has a transmission layer comprising an array of photon transmission apertures to transmit a plurality of photon beamlets and exterior surfaces capable of supporting plasmons. In this version, the multiple electron beam source also comprises a second lens to focus the plurality of photon beamlets transmitted from the plasmon generating photon transmission plate onto the photocathode. In one embodiment, the array of photon transmission apertures has periodic spacing in two dimensions. In one version, the photon beam comprises a plurality of photons having wavelengths of about $\lambda_0$ and each photon transmission aperture has a principal dimension $d_0$ which is about less than or equal to $\lambda_0$.

In another version, the multiple electron beam source comprises a photon beam modulator capable of individually blanking each photon beamlet in the plurality of beamlets. In one embodiment of this version, the photon beam modulator is an acousto-optic modulator.

In another version, the multiple electron beam source comprises a plurality of arrays of electron transmission gates on the photocathode and each gate within each array has an associated gate in each of the other arrays. In this version, there are also conducting leads electrically connecting the gate electrodes of associated gates to allow simultaneous control, with a single gate control voltage, of the transmission of electrons through associated gates.

In another aspect, a gated photocathode comprises a substrate having opposing first and second surfaces, a photon transmission layer on the first substrate surface comprising a photon receiving surface to receive a photon beam and an array of photon transmission apertures and surfaces capable of supporting plasmons, a conducting layer on the second substrate surface, an insulating layer on the conducting layer having an array of electron transmission apertures aligned with the array of photon transmission apertures, a gate layer on the insulating layer comprising an array of gate electrodes wherein each gate electrode is positioned about an electron transmission aperture and capable of receiving a gate control voltage, and a photoemissive layer about the insulating layer and gate layer and at least partially extending into each electron transmission aperture. The photoemissive layer is capable of emitting electrons and the emission of electrons is controlled by the gate control voltage. In one version, the photon transmission layer is a plasmon-generating photon transmission layer and the surfaces of the photon transmission layer are capable of supporting plasmons. In another version, the photon transmission layer is a zone plate and the array of photon transmission apertures is an array of zone plate elements.

In another version, the multiple electron beam source comprises a prism capable of receiving and transmitting the photon beam focused by a first lens, a photon beam modulator to modulate the photon beam transmitted by the prism and reflect a plurality of photon beamlets, and a second lens to focus the plurality of photon beamlets reflected by the spatial light modulator onto the photocathode. In one embodiment, the photon beam modulator comprises a spatial light modulator.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

FIG. 1 is a sectional view of an embodiment of a multiple electron beam source depicting an array of electron transmission gates having a surface facing the electron emitting surface of the photocathode;

FIGS. 2a-g are sectional views of different embodiments of electron transmission gate electrodes;

DESCRIPTION

Figure 1:
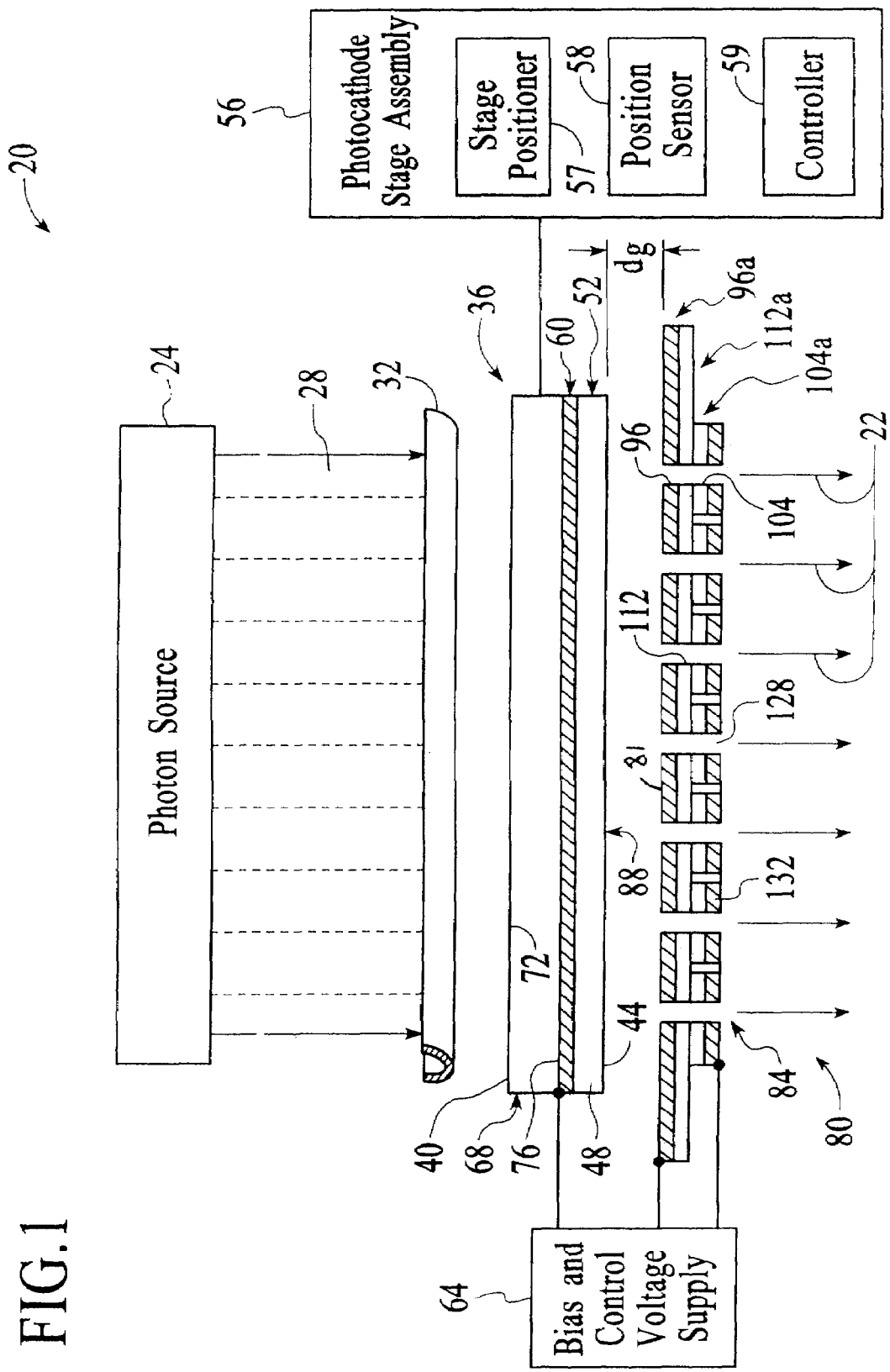

A multiple electron beam source 20 is capable of generating multiple, independently controllable electron beams 22, as illustrated in FIG. 1. The multiple electron beam source 20 can be used in an electron beam pattern generation apparatus to generate a pattern, as in, for example, electron beam lithography. While illustrative embodiments of the multiple electron beam source 20 are described in the present application, it should be understood that other embodiments are also possible, and thus, the scope of the claims should not be limited to the illustrative embodiments.

The multiple electron beam source 20 comprises a photocathode 36 capable of generating electrons from an incident photon beam. Electrons are generated in the photocathode 36 by the transfer of energy from photons incident on a photon receiving surface 40 of the photocathode 36 to electrons present in an electron emitting material 48 of the photocathode 36. The electron emitting material 48 absorbs photons that excite electrons in the electron emitting material 48, and a portion of the electrons that are excited are emitted from the photocathode 36. To be emitted from the photocathode 36, the energy absorbed by the electron from the photon must be higher than the electron emission energy of the electron emitting material 48. Electrons are emitted from an electron emitting surface 44 of the photocathode 36.

In one version, the electron-emitting material 48 comprises an alkali halide. The alkali halide material comprises at least one alkali metal and at least one halogen in a ratio that may be stochiometric or non-stoichiometric. Of the alkali halides, cesium halide materials have been found to have good results. In one version, the electron-emitting material 48 comprises a cesium bromide material. The cesium bromide material is advantageous because it has a high photoyield and low degradation over time in a vacuum environment. In another version, the electron-emitting material 48 comprises a cesium iodide material. The cesium iodide material is advantageous because it may be more stable in terms of temperature resistance or corrosion resistance. The electron-emitting material 48 may also be activated to increase its photoyield and stability by irradiating it with a radiation having a sufficiently high energy level and for a sufficiently long time period. The radiation may be, for example, UV, X-ray, visible light, or electron beams. For example, U.S. patent application Ser. No. 10/697,715, which is incorporated herein by reference in its entirety, discloses a method to create an activated electron emitting material.

In one version, the electron emitting material 48 of the photocathode 36 is arranged in a photoemissive layer 52 having the electron emitting surface 44. The photoemissive layer electron emitting surface 44 is the surface from which photons escape from the photocathode 36. In one version, the photoemissive layer electron emitting surface 44 is also an exterior surface of the photocathode. The photoemissive layer 52 also has a thickness $t_{PE}$. The thickness of the photoemissive layer 52 is selected to maximize the photoyield of the photocathode 36 and also to minimize transient effects in the generation of electrons experienced when alternately exposing and not exposing the electron emitting material to photons. In one version, $t_{PE}$ is about 150 nm to about 300 nm.

The photocathode 36 also comprises a conductor 60 capable of providing an electrical bias to the photocathode 36. A bias voltage applied to the conductor 60 is capable of electrically biasing the photocathode 36 in general, including the electron emitting material 48. The conductor 60 is substantially transparent to the incident photons in the photon beam 28. The conductor 60 also provides a material with good adhesion and low chemical reactivity upon which other materials of the photocathode 36 may be formed. The conductor 60 can be in the form of a single layer of material. In this version, the conductor 60 is a conducting layer 60. The conductor 60 comprises a metal such as, for example, Mo, Cr, Ta, and Ti. These metals are good conductor materials because they have high conductivity and also low photon absorption at desirable photon wavelengths.

In one version, the multiple electron beam source 20 comprises a photon source 24 to generate a photon beam 28 comprising a plurality of photons. The photon source 24 can be a light source that produces light in the ultraviolet, visible, or infrared parts of the frequency spectrum. For example, the photon source 24 can be a high intensity lamp producing a single beam of photons. In one version, the high intensity lamp comprises a halogen lamp producing light in the UV range, for instance light with a wavelength of about 250 nm to about 400 nm. The advantages of using a high intensity lamp to produce a photon beam 28 include the simplicity and cost effectiveness of such a photon source, as well as its compactness. In another version, the photon source 24 can be a laser beam source that generates a laser beam. For example, the laser beam source can comprise an argon ion laser beam source. In this version, the photon source can produce a laser beam with a wavelength of about 248 nm to about 360 nm, or more preferably, at about 257 nm. In this version, the photon beam source 24 may also comprise a frequency multiplier to increase the frequency of the laser beam. For example, the frequency multiplier may comprise a beta barium borate crystal that approximately doubles the frequency of the laser beam. For an argon ion laser beam source having a fundamental wavelength of about 514 nm, a frequency multiplier can double its frequency; or, in other words, halve its wavelength to about 257 nm. The advantages of using a laser beam source as the photon source 24 include the accuracy and tunability of such a source, as well as its relatively high photon fluence.

In one version, the multiple electron beam source 20 also includes a lens 32, or a plurality of such lenses, capable of focusing, directing, or otherwise controlling the intensity distribution of the photon beam 28. In one version, the lens 32 has a cylindrical or spherical shape. For example, a cylindrical lens may used to shape and direct a photon beam 28 at a substantially rectangular portion of a photon receiving surface, and a spherical lens may be used to distribute the photon beam across a substantially square portion of a photon receiving surface. A substantially rectangular or substantially square portion of a photon receiving surface may correspond to a selected subset of the components of the multiple electron beam source 20. The lens 32 comprises a material that has a high transparency to the photon beam to minimize energy loss. The lens 32 may comprise, for example, fused silica, aluminum oxide, polycrystalline alumina, sapphire, ruby, calcium fluoride, and may also be doped. In some versions, however, the multiple electron beam source 20 may not require a lens 32, or the function of the lens 32 may be incorporated into another component of the multiple electron beam source 20, such as, for example, the photon source 24.

The photocathode 36 is movable relative to the multiple electron beam source 20 to allow repositioning of the portion of the electron emitting material 48 being exposed to the photon beam 28. For example, if the portion of the electron emitting material 48 being exposed exhibits reduced photoyield, the photocathode 36 may be repositioned so that a fresh portion of the photocathode 36 is exposed to the incident photon beam 28. Thus, the multiple electron beam source 20 with a movable photocathode 36 has a longer useful lifetime and can provide more stable levels of electrons during operation than an electron beam source with a photocathode having a fixed position.

In one version, the multiple electron beam source 20 comprises a photocathode stage assembly 56 that is capable of moving the photocathode 36 relative to other components of the multiple electron beam source 20 such as the photon source 24. The photocathode stage assembly 56 comprises a stage positioner 57, which may position the photocathode 36 in fine incremental steps of about 1 μm to about 100 μm and coarse incremental steps on the order of mm or cm. The stage positioner 57 may comprise a flexure activated by a piezoelectric actuator that can position the photocathode 36 in fine incremental steps along two axis. The flexure comprises an elastically deformable structure that can produce frictionless, straight movement in two dimensions. The flexure is activated by a piezoelectric actuator. The piezoelectric actuator produces a mechanical movement, in response to an electric signal, that is used to activate the flexure. The piezoelectric activated flexure is capable of repeatable, high resolution positioning in a vacuum environment. The stage positioner 57 may also comprise a stepper motor to achieve coarse incremental positioning.

The photocathode stage assembly 56 also comprises a stage position sensor 58 that is used to measure the position of the photocathode 36 relative to the frame of reference of the multiple electron beam source 20 or some specific component of the multiple electron beam source 20 such as the photon source 24. In one version, the stage position sensor 58 operates optically and may comprise an interferometer, for example, a laser interferometer. In another version, the stage position sensor 58 may comprise a capacitive sensor, for example, a two-plate capacitive sensor.

In one version, the photocathode stage assembly 56 also comprises a stage controller 59 that receives data from the stage position sensor 58 and sends instructions to the stage positioner 57 to control movement of the photocathode 36. The stage controller 59 may comprise a computer having a central processing unit, random access memory, data storage, a user interface, and program code having instruction sets for receiving data from the stage position sensor 58 and sending instructions to the stage positioner 57. In another version, the photocathode stage controller 59 may be part of an overall controller for the entire multiple electron beam source 20.

The photocathode stage assembly 56 is capable of moving the photocathode 36 relative to the frame of reference of the multiple electron beam source 20, or any of its components, in several different modes. In one mode, the photocathode 36 can occupy a static position during electron beam generation. In this mode, the photocathode 36 can be moved periodically when the exposed portion of the electron emitting material 48 begins to display reduced photoyield. In another mode, the photocathode 36 can occupy a dynamic position during electron beam generation. For example, the photocathode 36 can be oscillated relative to the multiple electron beam source 20, or any of its components, during the generation of electron beams 22. This is advantageous to continuously expose a fresh portion of the electron emitting material 48 of the photocathode 36. In one version, the photocathode 36 can be oscillated at a rate of up to about 5 Hz relative to the frame of reference of the multiple electron beam source 20. Oscillation of the photocathode 36 can be set up in various ways. The oscillation can be a one dimensional movement back and forth along a line, or can be some more complicated motion, such as along a circle or some other. curvature, such as a multiple radius arcuate path.

Bias voltages for the multiple electron beam source 20 are supplied by a bias and control voltage supply 64. The conductor 60 is typically negatively biased. In one version, the conductor 60 is capable of receiving a bias voltage with a magnitude of about 50 kV to about 100 kV. The advantage of using a relatively high bias voltage magnitude such as this is that electrons of a relatively high energy are generated by the multiple electron beam source 20. High energy electrons are useful for exposing relatively thick layers of electron sensitive resist because they are able to travel through the entire resist layer and produce a uniform exposure dosage through the thickness of the resist layer. In contrast, lower energy electrons may produce a dosage gradient in a relatively thick resist layer. In another version, the conductor 60 is capable of receiving a bias voltage with a magnitude of about 1 kV to about 5 kV. The advantage of using a relatively low bias voltage magnitude such as this is that electrons with a relatively low energy are generated by the multiple electron beam source 20. Low energy electrons are useful to limit proximity effects when exposing an electron sensitive resist layer. Proximity effects occur when the electron energy is high enough to generate secondary electrons in the resist layer, which can then expose an area proximate to the area exposed by the incident electron beam, potentially reducing the resolution of a pattern being generated.

In one version, the electron emitting material 48 and conductor 60 of the photocathode 36 are formed on a substrate 68. The substrate 68 provides structural strength and facilitates the fabrication of the photocathode 36. The substrate 68 typically comprises a material that is permeable to photons in a predefined band of wavelengths, so that photons can pass through the substrate 68 to reach the electron-emitting material 48. For example, the substrate 68 may comprise sapphire. In one version, the substrate 68 comprises a first surface 72 facing the photon source 24 and a second surface 76 opposing the photon source 24. In this version, the conducting layer 60 is formed on the second surface 76 of the substrate 68, and the photoemissive layer 52 comprising the electron emitting material 48 is formed on the conducting layer 60. Thus, the electron emitting surface 44 of the photoemissive layer 52 of the photocathode 36 substantially opposes the photon source 24. However, in other versions, the electron emitting surface 44 of the photocathode 36 may form other spatial relationships with the photon source 24, such as perpendicular or at some acute or obtuse angle to the photon source 24.

The multiple electron beam source 20 also comprises an array 80 of electron transmission gates 84. Each gate 84 of the array 80 controls transmission of electrons emitted by an emission region 88 of the electron emitting surface 44 of the photocathode 36 which is aligned with the gate 84. Each individual electron beam 22 generated by the multiple electron beam source 20 comprises the electrons transmitted through an individual electron transmission gate 84. The electron transmission gate 84 can be electrically controlled, for example, the gate 84 can be opened, closed or partially opened. When open, the gate 84 allows passage of electrons emitted by the photocathode 36, and when closed, electrons are repelled or deflected. When partially opened, the gate 84 controls the degree to which electrons are transmitted.

In one version, as shown in FIG. 1, the array 80 of electron transmission gates 84 has a surface 81 facing the electron emitting surface 44 of the photocathode 36. This surface 81 is spaced apart from the electron emitting surface 44 of the photocathode 36 by a separation distance $d_g$. In this version, the presence of the array 80 of electron transmission gates 84 does not impede movement of the photocathode 36 relative to the gate array 80. The separation distance $d_g$ also facilitates alignment of the array 80 of electron transmission gates 84 to a substrate upon which it is desirable to generate a pattern. For example, the gate array 80 can be aligned to a substrate support onto which substrate is placed for pattern generation. The photocathode 36 can be moved relative to the gate array 80 during pattern generation, for example, to expose a fresh portion of the electron emitting material 48, without loosing the alignment of the gate array 80 to the substrate support and the substrate. In one version, the separation distance $d_g$ is about 10 µm to about 100 µm. A separation distance of less than about 100 µm is advantageous because this distance prevents excessive loss of electrons traveling this distance between the photocathode 36 and the array 80 of electron transmission gates 84. Larger separation distances typically result in undesirable loss of electrons with trajectories sufficiently tangential to the photocathode 36 and due to interactions these electrons may undergo while traveling from the photocathode 36 to the array 80 of electron transmission gates 84. A separation distance of greater than about 10 µm is advantageous because it is relatively easier to manufacture than smaller separation distances.

Each electron transmission gate 84 comprises an anode 96. The anode 96 is capable of accelerating electrons emitted from the electron emitting surface 44 towards the gate array 80. The anode 96 is capable of receiving a bias voltage from the bias and control voltage supply 64. In one version, the anode 96 is positively biased relative to the photocathode 36. A positive bias is advantageous to accelerate a negatively charged particle such as an electron away from a less positive bias. In one embodiment, the anode 96 is biased with a voltage relative to the conductor 60 with a magnitude of about 5 V to about 10 V. The anode 96 comprises a conducting material such as a metal. For example, in one version, the anode 96 comprises a metal such as aluminum, gold and copper.

Each electron transmission gate 84 also comprises an insulator 104 between the anode 96 and other components of the gate 84 to electrically isolate the anode 96 from the other components. The insulator 104 also forms a separation distance between the anode 96 and a gate electrode 132 which contributes to the electrically properties of the gate 84. The insulator 104 comprises a material that is relatively electrically non-conducting. For example, the insulator material may be a dielectric or semiconductor material. In one version, the insulator 104 comprises a dielectric film, such as, for example, silicon dioxide. Silicon dioxide is advantageous because it has excellent insulating properties is readily formed using common lithographic manufacturing methods. The insulator may comprise other insulating materials, including, for example, other oxides, a ceramic, organic materials, or mixtures thereof.

In one version, the electron transmission gate 84 comprises a membrane 112 upon which the anode 96 and insulator 104 are formed. The membrane 112 provides structural integrity to the gate 84 and a compatible substrate upon which other components of the gate 84 can be formed. The membrane 112 has first and second opposing surfaces, and in one version the anode 96 is on the first surface and the insulator 104 on the second. In one embodiment, the membrane 112 comprises a silicon containing material such as silicon, silicon nitride, silicon carbide or mixtures thereof. A silicon containing material is advantageous because it is compatible with common lithographic manufacturing processes and is a suitable basis upon which the metal anode 84 and the insulator 104, such as, for example, a dielectric film like silicon dioxide, can be formed. The membrane may also comprise other materials such as, for example, diamond and boron nitride. In other versions of the gate 84, there is no membrane 112, and another component, such as the anode 96, can serve as a structural member and substrate for other components of the gate 84.

The anode 96, insulator 104, and membrane 112 have an aperture 128 through which electrons can pass that is sized and shaped according to the desired size of an individual electron beam 22. In one version, a single electron beam is used to generate a single pixel in a pattern, and thus, the size of the aperture 128 corresponds to the size of the pixel in the pattern. In some embodiments, it is desirable to have small apertures 128 in order to generate patterns with small pixel sizes and thus high resolution. In one embodiment, the aperture 128 is circular shaped, which is advantageous because of its symmetry. In another embodiment, the aperture 128 is rectangular or square shaped, which is advantageous because it may be easier to form. Although circular and rectangular shapes have been discussed, other aperture shapes are also possible.

In one version, components common to all of the electron transmission gates 84 in the array 80 are formed together as layers. For example, anode layer 96a comprises a layer of conducting material having an array of apertures 128 corresponding to the positions of the gates 84 in the array 80. Likewise, the insulators 104 and membranes 112 for all the gates can also be formed together as insulator layer 104a and a membrane layer 112a, each comprising an array of apertures 128 corresponding to the positions of the gates 84. In another version, some components of the array 80 of gates 84 can comprise layers and some components can be formed individually for each gate 84 in the array 80.

Each electron transmission gate 84 also comprises a gate electrode 132 on the insulator 104 which is capable of receiving a gate control voltage that controls the transmission of electrons through the gate 84. The gate electrode 132 comprises an electrically conducting material such as a conductor or semiconductor. In one version, the gate electrode 132 comprises a metal, such as for example, aluminum, titanium, copper, platinum or gold. Any metal with relatively good conductivity and which is readily lithographically processed is a suitable gate electrode material.

The electron transmission gate 84 controls the transmission of electrons from the electron emitting surface 44 of the photocathode 36 by generating an electric field about the gate aperture 128 that either further accelerates the electron through the aperture 128 or exerts a repulsive force on the electron which works against its passage through the aperture 128. For example, in a first gate control scenario, the gate control voltage is equal to or positive relative to the anode bias voltage. An equal or positive gate control voltage reinforces a pattern of voltage biases on the photocathode 36 and the anode. Thus, in this scenario, there are non-negative voltage bias increments from the photocathode 36 to the anode 96 to the gate electrode 132. The electric fields generated by these biased components together form an electric field that continuously accelerates electrons emitted form the photocathode 36 through the gate aperture 128. This scenario corresponds to an open electron transmission gate 84.

In a second gate control scenario, the gate control voltage is negative relative to the anode bias voltage. A negative gate control voltage reverses the biasing trend established from the photocathode 36 to the anode 96. In this second scenario, the gate control voltage, negative relative to the anode bias voltage, creates an electric field that works oppositely to the electric field created by the combination of the biased anode 96 and photocathode 36. The electric field created by the gate electrode 132 relative to the anode 96 and photocathode 36 thus works against the passing of electrons emitted from the photocathode 36 through the aperture 128. The gate control voltage must be sufficiently negative to create a repulsive electric field sufficient to counteract the accelerating electric field created by the anode bias voltage. In one version, the electric field created by the gate control voltage need not fully repulse the electrons emitted from the electron emission surface 44. The repulsive electric field may instead deflect the electrons sufficiently to misalign the electron beam 22 relative to electron optics that manipulate the beam 22 after it leaves the multiple electron beam source 20. The second gate control scenario corresponds to a closed or partially closed electron transmission gate 84.

In one version, the gate control voltage is a summation of an electrode bias voltage and a gate signal voltage. In one embodiment, the electrode bias voltage can be the same as the photocathode bias voltage. For example, the electrode bias voltage can be about −50 kV. In one version, the gate signal voltage comprises a range of voltages of from about −10V to about +10V. For example, in this version, a gate signal voltage of about −10V would be applied to turn the gate 84 off, and a gate signal voltage of about 0V to about +10V would be applied to turn the gate 84 on.

Figure 2:
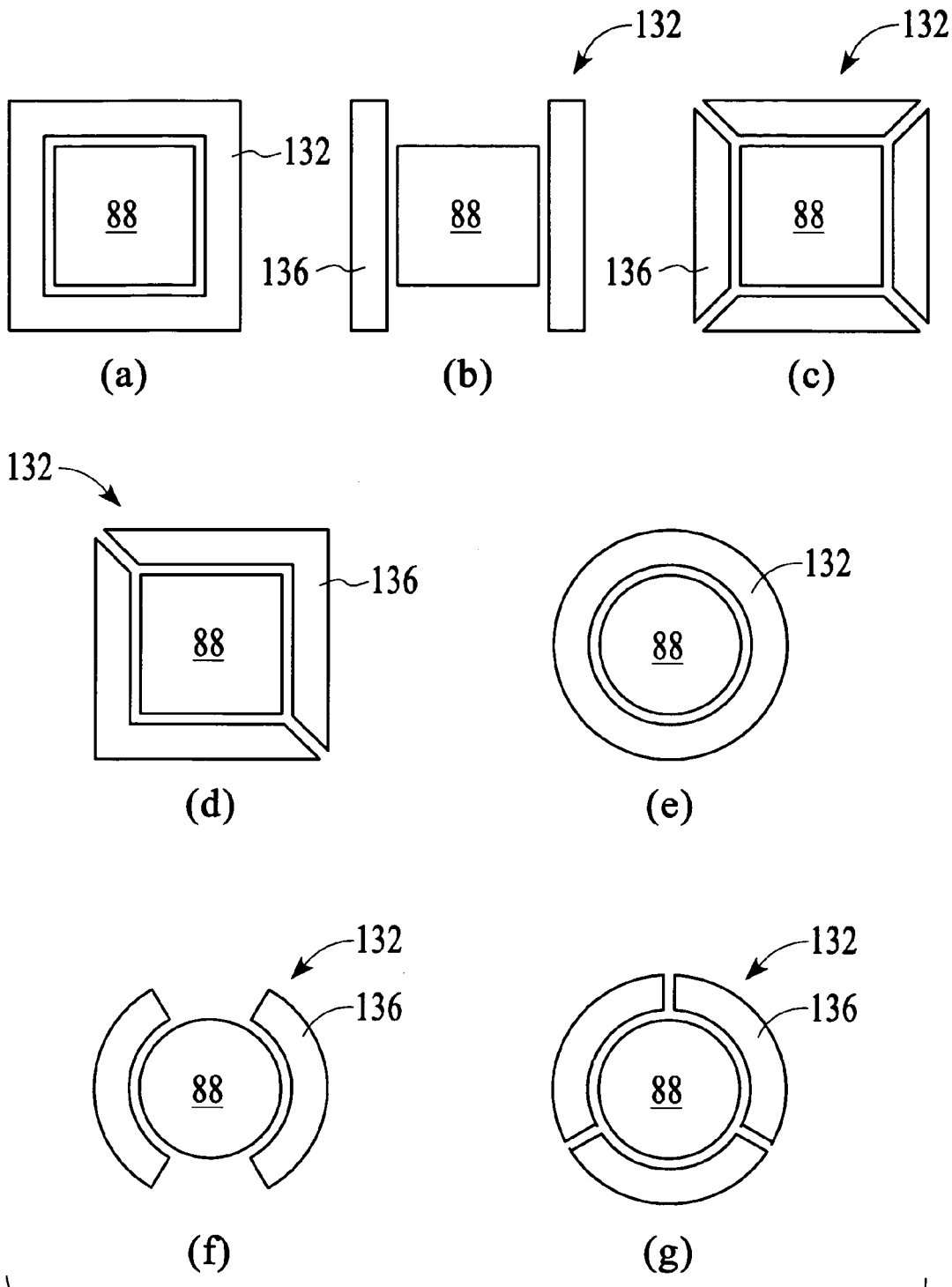

The gate electrode 132 can have different configurations, as illustrated in FIGS. 2*a-g*. In one version, the electron transmission gate electrode 132 comprises a single continuously electrically conducting structure capable of controlling transmission of electrons from the entire emission region 88 corresponding to the gate 84 with a single gate control voltage. This is advantageous if the electron beam emanating from the gate 84 corresponds to a single pixel in a pattern. An example of such a electrode configuration is shown in FIGS. 2*a,e*. The electrode configuration shown in FIG. 2*b* can also be used as a single electrically conducting region with the addition of a conducting trace between the disconnected portions of the electrode 132.

In another version, the electrode 132 comprises a plurality of individually electrically addressable electrode segments 136 positioned about the aperture 128. This type of gate electrode configuration is capable of independently controlling electron transmission from different portions of the emission region 88 corresponding to the gate aperture 128. For example, multiple electrode segments 136 may be capable of turning on or off the transmission of electrons through a selected portion of the emission region 88 which is less than the total area of the aperture 128. This is advantageous when the pixel size of the pattern to be generated is smaller than the gate aperture size. Multiple gate electrode segments 136 may also be capable decreasing electron transmission through portions of the gate aperture 128 without completely turning off the electron transmission. This is advantageous to achieve gray levels of exposure to electrons during pattern generation. FIGS. 2*b-d,f,g* illustrate several examples of a gate electrode comprising a plurality of electrode segments 136.

The electron transmission gate electrodes 132 have a thickness which is selected to provide suitable operation of the electron transmission gates 84. The thickness of the gate electrode 132 is one parameter that selects the distance over which electrons passing through the gate aperture 128 are subjected to either an accelerating or repulsive force. For low energy electrons the gate thickness can be selected to be relatively thin. For example, in one version, the gate thickness is selected to be less than about 125 nm. For higher energy electrons, the gate thickness can be selected to be relatively larger, such as about 10 µm to about 100 µm. Another parameter that selects the distance over which electrons are accelerated or repulsed is the thickness of the insulator 104.

The array 80 of electron transmission gates 84 has periodic spacing in two dimensions. The array 80 can be thought of as having rows and columns, however these designations are relative and possibly interchangeable, and thus should not be used to limit the scope or spirit of the invention. Gates 84 in rows have a spacing $s_R$ between the centers of adjacent gates 84, and gates 84 in columns have a spacing $s_C$ between the centers of adjacent gates 84. In one version, $S_R$ is selected to be equal to $s_C$. In one embodiment, the array 80 is arranged as a uniform square grid of gates 84. In this embodiment, all the gates 84 in a row or column of the array 80 are along a straight line. In another version, however, the array 80 can be arranged in non-uniform pattern, with gates 84 in a row or column deviating from a straight line. In this version, $S_R$ does not necessarily equal $s_C$.

The array 80 can be further organized into groups of rows that have associated functionality. For example, a functional multiple electron beam source 20 may consist of a number of rows, $n_O$, which is less than the total number of rows, $n_T$, of the gate array 80. In operation, the photon source 24 may expose just this group of rows at any one time, or may alternately expose different groups of rows. Grouping rows may be convenient to generate a certain pattern, or may work in tandem with a movable photocathode 36 to provide access to a fresh portion of the photocathode 36. Different groupings of rows of the gate array 80 may be selected such that different patterns can be simultaneously generated by the multiple electron beam source 20, with different patterns being generated by different groupings of rows. Alternatively, the same pattern may be simultaneously generated on separate substrates or separate portions of a single substrate by different groupings of rows. In one version, a plurality of arrays of electron transmission gates are driven by a plurality of photon beams.

In one version, the multiple electron beam source 20 comprises an array 80 of electron transmission gates 84 containing a single row of gates 84. Each individual gate 84 in the row is capable of exposing a single pixel in a pattern. In another version, the multiple electron beam source 20 comprises an array 80 of electron transmission gates 84 having a plurality of rows. The gates 84 corresponding to a single column, comprising gates 84 from each of the plurality of rows, are capable of exposing a single pixel in a pattern. The plurality of gates 84 in the single column are individually capable of exposing gray levels of a single pixel in a pattern. For example, a subset of the gates 84 in a single column can be used to expose part of a pixel in a pattern.

Figure 3:
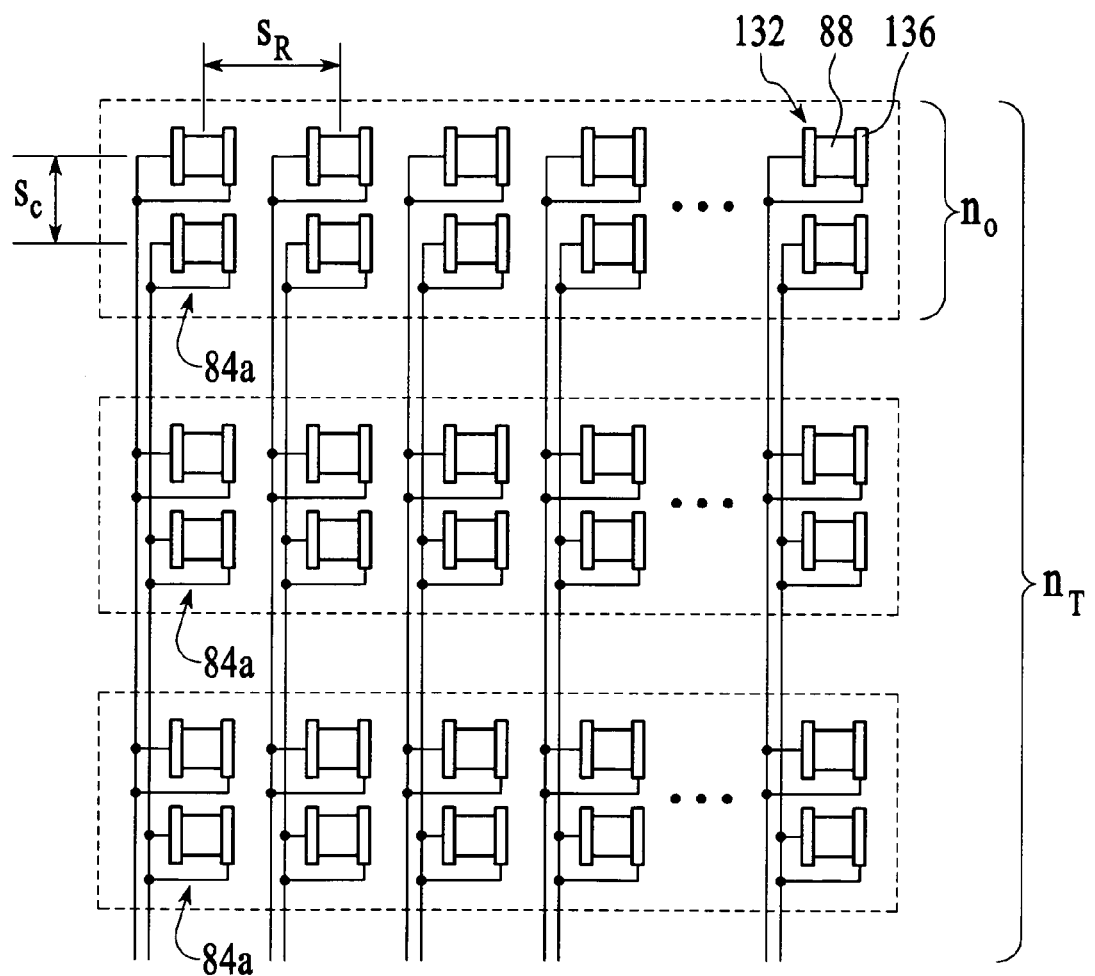
FIG. 3 is a schematic view of a plurality of arrays of electron transmission gates.

In one version, the multiple electron beam source 20 has a plurality of arrays 80 of electron transmission gates 84. In one version, the plurality of arrays 80 are organized such that they are duplicate arrangements of each other. In this version, each gate 84 in each array has an associated gate 84*a* in each other array 80. The multiple electron beam source 20 comprises conducting leads 144 that connect together electrodes 132 of groups of associated gates 84*a*. For example, a single electrically continuous lead 144 may connect one gate electrode 132 from each of the plurality of arrays with the electrode of the associated gate 84*a* in each of the other arrays 80. In this configuration, transmission of electron beams 22 from each of the plurality of arrays 80 can be controlled with one set of gate electrode control voltages. An example of this configuration is illustrated in FIG. 3. Wiring the plurality of gate arrays 80 in parallel reduces the amount of wiring necessary for a plurality of gate arrays 80. This can be critical as the aperture size of the gates 84 is reduced to allow for the generation of patterns with higher resolution.

Figure 4:
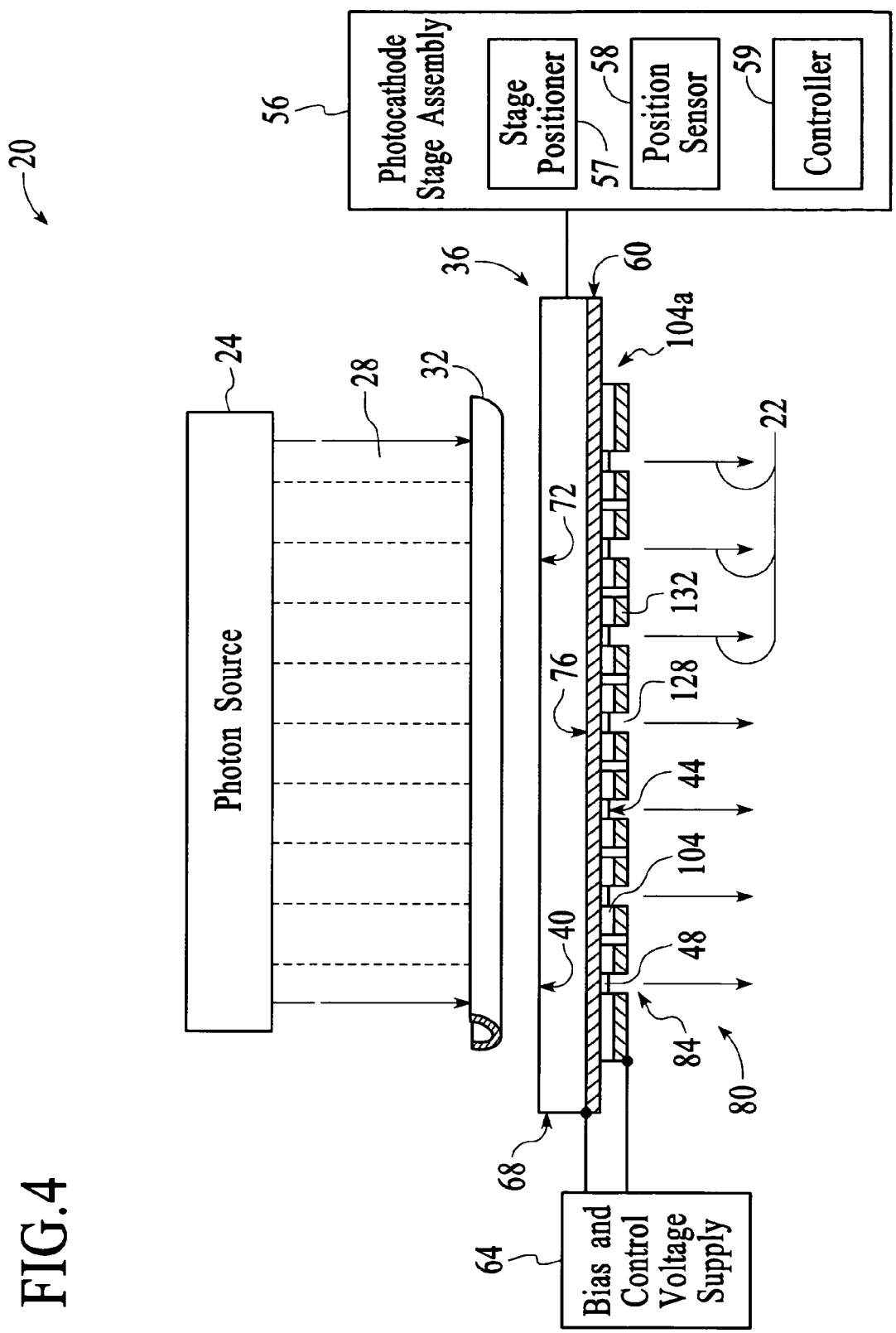
FIG. 4 is a sectional view of another embodiment of the multiple electron beam source.

Another benefit of a plurality of arrays 80 of electron transmission gates 84 with common control wiring is that each array 80 constitutes a separate complete multiple electron beam source 20. Thus, each array 80 is capable of replacing the functionality of one of the other arrays 80. This is advantageous if the area of the photocathode 36 with which a particular gate array 80 is aligned begins to have a reduced photoyield. In this situation, the functionality of the gate array 80 can be switched to another gate array 80 without switching control voltages. This gate array switching technique can be used on its own or in combination with moving the photocathode 36 relative to the multiple electron beam source 20. In one embodiment of this version, in which gate array switching is accomplished without moving the photocathode 36 relative to the gate array 80, the gate array 80 can be formed directly on the photocathode 36, as illustrated in FIG. 4. In this embodiment, each gate 84 has the insulator 104 formed directly on the conducting layer 60 of the photocathode 36, the insulator 104 has an aperture 128 for electron transmission, the electron emitting material 48 is formed in the aperture 128, and the gate electrode 132 is formed on the insulator 104 about the aperture 128.

Figure 5:
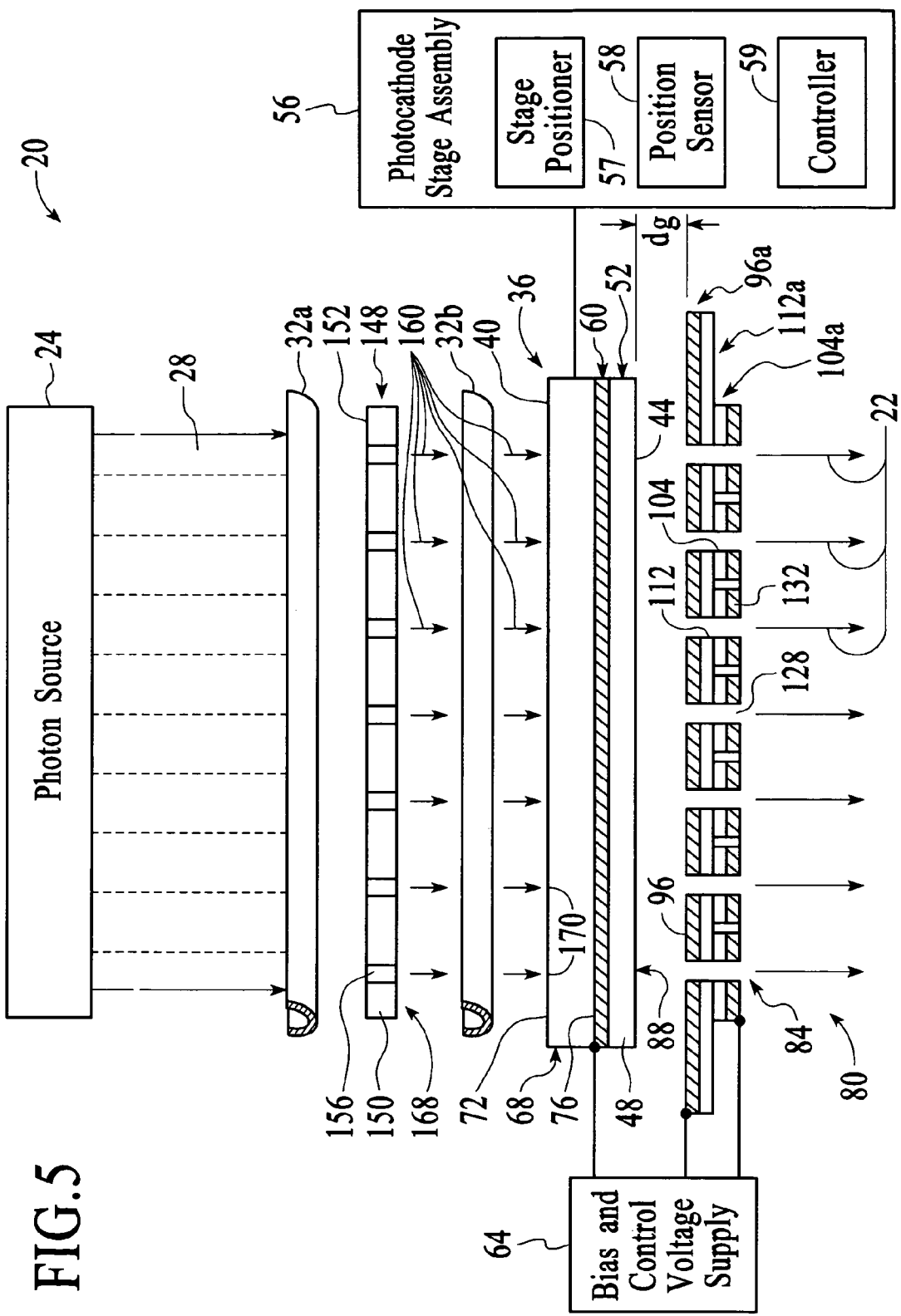
FIG. 5 is a sectional view of yet another embodiment of the multiple electron beam source.
Figure 6A:
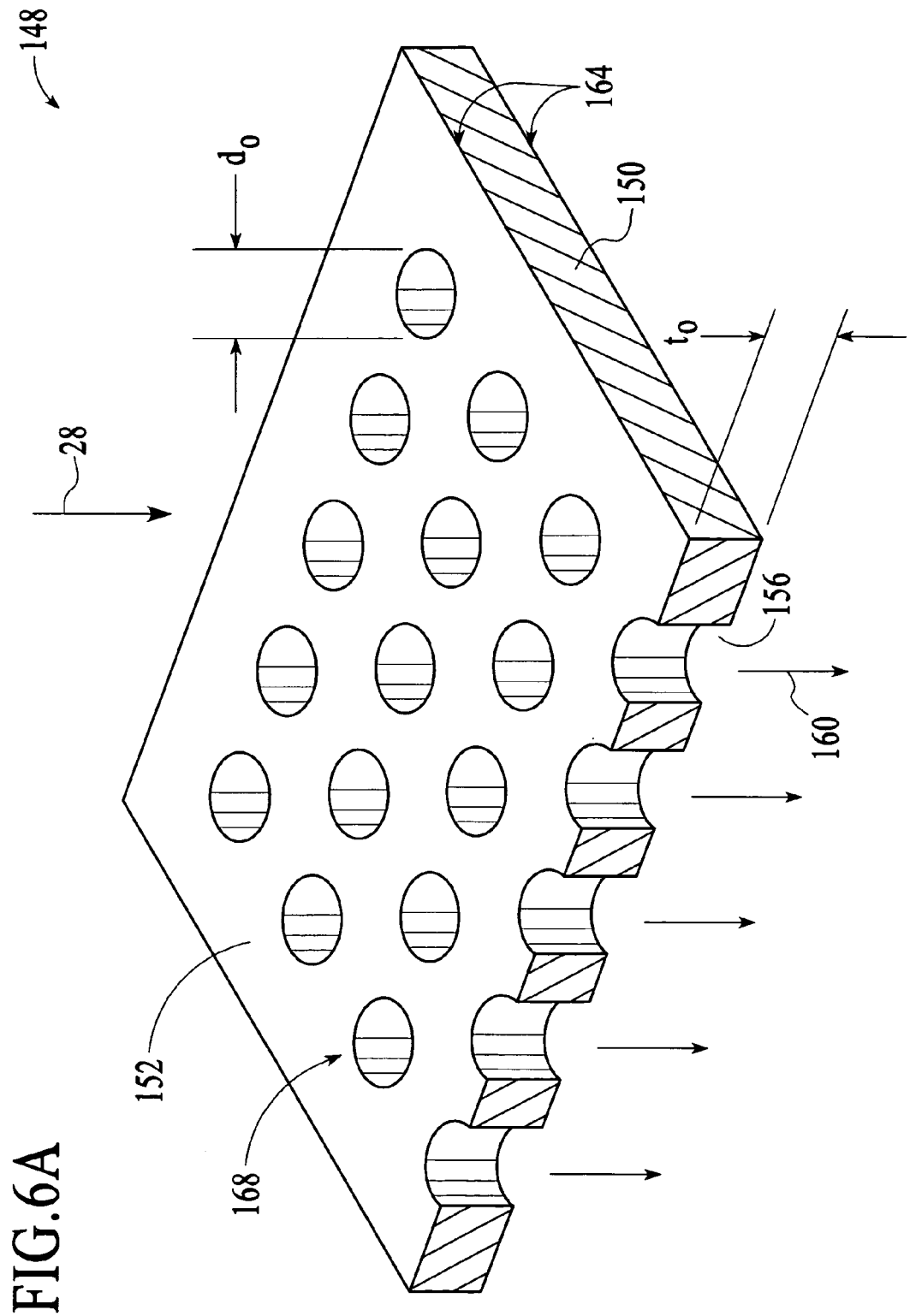
FIG. 6a is a perspective view of an embodiment of a plasmon-generating photon transmission plate.

Another embodiment of the multiple electron beam source 20, illustrated in FIG. 5, comprises a plasmon-generating photon transmission plate 148. The plasmon-generating photon transmission plate 148 is capable of modifying, filtering, and enhancing the transmission of photons through the plate 148. The plasmon-generating photon transmission plate 148 comprises an array 168 of photon transmission apertures 156 in a transmission layer 150, as illustrated in FIG. 6a. The array of apertures is capable of transmitting a plurality of photon beamlets 160 when a photon beam 28 is incident on a photon receiving surface 152 of the transmission plate 148. The plasmon-generating photon transmission plate 148 is believed to affect the transmission of photons by exchanging energy between photons and plasmons on exterior surfaces 164 of the transmission plate 148. Photons incident on the photon receiving surface 152 couple energy into plasmons on exterior surfaces 164 of the transmission layer 150. Surface plasmons are wave-like excitations of electronic particles on the surface of a material. Plasmons generated on the exterior surfaces 164 of the transmission layer 150 can couple energy into photons leaving the transmission layer 150 at the photon transmission apertures 156. Furthermore, the creation of resonant modes of surface plasmon excitation is believed to enhance energy coupling between photons and plasmons. The plasmon-generating photon transmission plate 148 is designed to encourage the creation of plasmon resonances.

Each photon transmission aperture 156 transmits a photon beamlet 160 and comprises a characteristic shape having a principal dimension $d_0$. The aperture shape is selected to generate a region of photon incidence 170 on the photocathode 36 corresponding to a desired shape and size. For example, the shape of the photon transmission aperture 156 can be selected to correspond to the shape of the aperture 128 of the electron transmission gate 84, such as a circular or square shape. The principal dimension $d_0$ of the aperture 156 is a dimension of the aperture 156 that is a measure of its overall size. The principal dimension $d_0$ of a circular shape is the diameter of the circle and the principal dimension $d_0$ of a square shape is the length of a side of the square. The aperture 156 can also comprise shapes other than circles and squares. Each photon transmission aperture 156 also has a length, $t_0$, equal to the thickness of the transmission layer 150.

Figure 7:
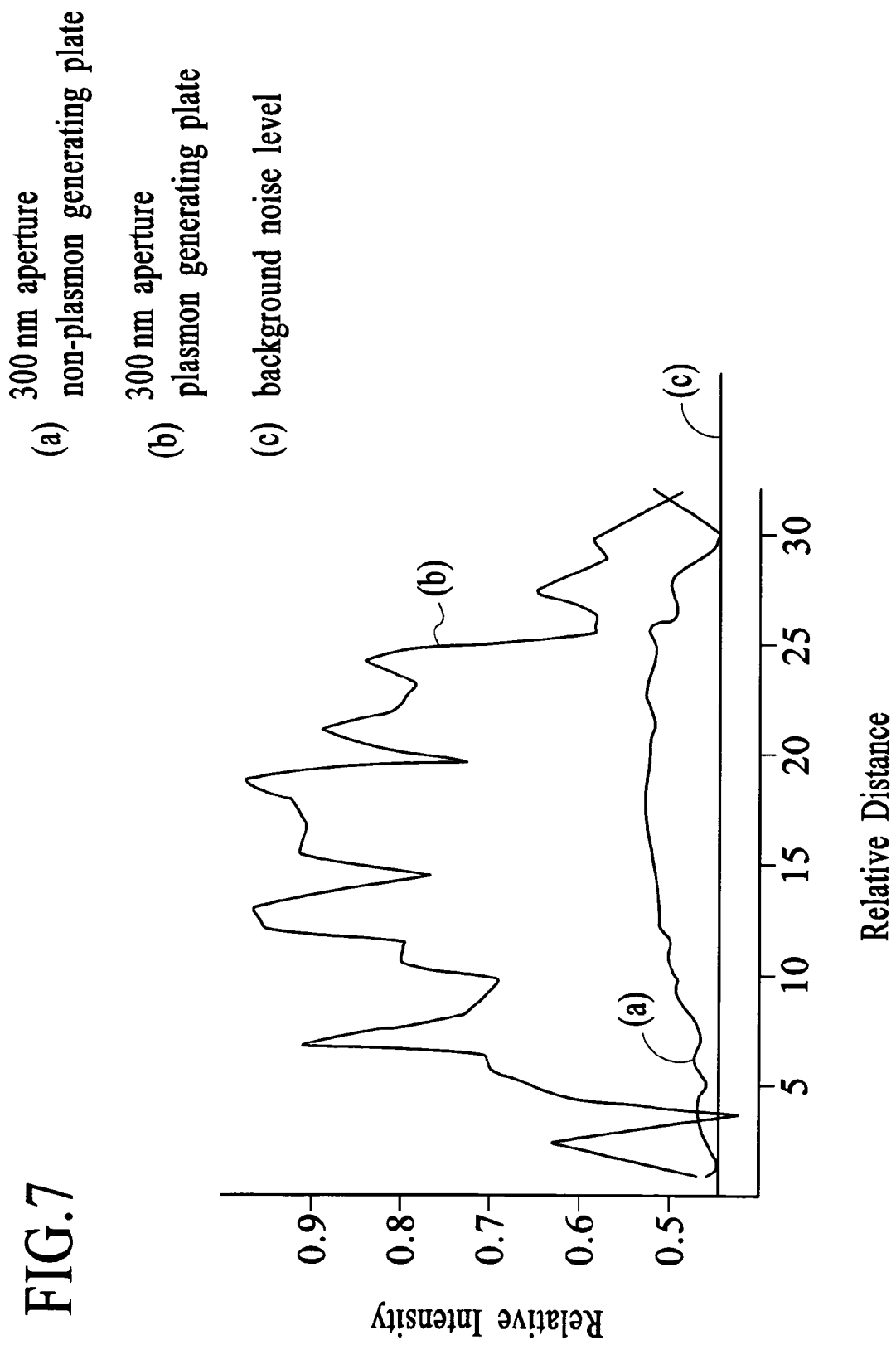
FIG. 7 is a graph showing the relative intensity of photons transmitted by the plasmon generating photon transmission plate in comparison to a non plasmon-generating photon transmission plate.

The principal dimension $d_0$ of the photon transmission aperture 156 is typically less than or equal to the wavelength of photons generated by the photon source 24. The plasmon-generating photon transmission plate 148 is capable of enhancing the transmission of photons through sub-wavelength apertures 156, which would otherwise be relatively poor. An example of the transmission efficiency of the plasmon-generating photon transmission plate 148 versus a non plasmon-generating photon transmission plate is shown in FIG. 7. In this figure, a photon beam of wavelength about 257 nm is transmitted through two plates having apertures of about 300 nm. On a first plate, data set (a) in FIG. 7, surface plasmons are not excited on the plate, and on the second plate, data set (b) in FIG. 7, surface plasmons are excited on the plate 148. Data set (b) can be seen to have a greatly improved transmission efficiency.

In one version, the array 168 of photon transmission apertures 156 is a two dimensional array with periodic spacing in both dimensions. In this version, the periodic spacing of the array 168 is selected to enhance the generation of plasmons and plasmon resonances on the exterior surfaces 164 of the transmission layer 150. In one embodiment, the array 168 has the same periodic spacing, $p_0$, in both dimensions. The period $p_0$ can be chosen to select the photon transmission qualities of the transmission plate 148. For example, the period $p_0$ can be selected to maximize the transmission of photons through sub-wavelength apertures 156.

In one version, the pattern of the array 168 of photon transmission apertures 156 is chosen to align with the pattern of the array 80 of electron transmission gates 84. In this version, each photon transmission aperture 156 is spatially aligned with an electron transmission gate 84. For example, each photon transmission aperture 156 can be positioned directly above an electron transmission gate 84. An advantage of this version is that the plasmon generating photon transmission plate 148 can be used to focus photons on regions of photon incidence 170 on the photocathode photon receiving surface 40 corresponding to electron transmission gates 84. In one embodiment of this version, photons are focused onto regions of photon incidence 170 that are larger than the emission region 88 of a gate 84, but not excessively larger, which avoids unnecessary heating of the photocathode 36. An advantage of this embodiment is that it facilitates alignment of the photon transmission plate 148 to the photocathode 36 and the array 80 of electron transmission gates 84. In one example, the size of the photon transmission aperture 156 is selected to be about 100% to about 150% of the size of the electron transmission gate aperture 128, generating a region of photon incidence 170 of about 150% to about 200% of the size of the electron transmission gate aperture 128.

Figure 6B:
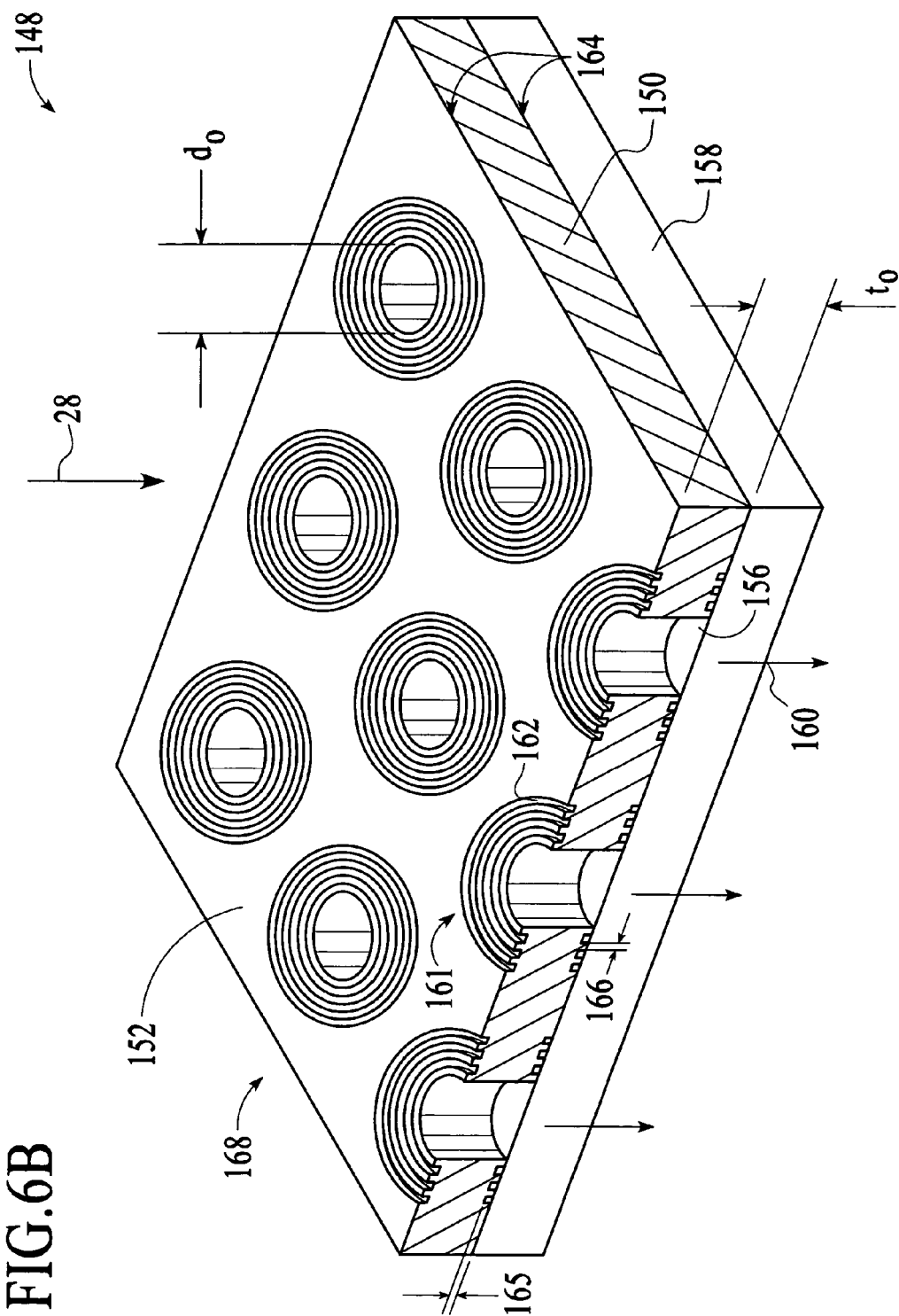
FIG. 6b is a perspective view of another embodiment of the plasmon-generating photon transmission plate.

In one version, as illustrated in FIG. 6b, the plasmon-generating photon transmission layer 150 also comprises one or more spatial gratings 161 to enhance the transmission of photons through the transmission plate 148. The spatial gratings 161 are located on the external surfaces 164 of the transmission layer 150, and may be located on either a photon receiving surface 152 of the transmission layer, or the surface opposing the photon receiving surface 152, or both. In one embodiment, each spatial grating 161 comprises a plurality of grooves 162 concentric to a photon transmission aperture 156. The grooves 162 have a depth 165 relative to the external surface 164 of the transmission layer 150 on which they are located. The spatial grating 161 also comprises a distance 166 between adjacent grooves 162. The depth 165 and distance 166 between grooves 162 are selected to enhance the transmission of photons through the transmission plate 148.

The plasmon-generating photon transmission layer 150 comprises a material upon which it is suitable to generate surface plasmons. An example of a suitable material is a metal, which has a relatively large amount of free-ranging electrons to support the generation of plasmons. The transmission layer 150 can comprise any metal, with good examples being aluminum, silver, gold, chromium and copper. The metal should be chosen to maximize the generation of plasmons on the exterior surfaces 164 of the transmission layer 150 at the wavelength of the photons of the beam 28 generated by the photon source 24.

In one version, the plasmon-generating photon transmission plate 148 comprises a substrate 158 on which the transmission layer 150 is formed, as also illustrated in FIG. 6b. This is advantageous to facilitate the manufacture of the transmission layer 150. For example, it may be easier to form a relatively thinner transmission layer 150 on a substrate 158 in a substrate processing apparatus than to form a independent transmission layer 150. Furthermore, it may be possible to have greater control over the properties of the transmission layer 150 formed on a substrate 158. The substrate 158 comprises a material substantially transparent to the wavelength of photons produces by the photon source 24, such as, for example, sapphire and fused silica, although other substrate materials are possible.

The transmission plate can be used to create a plurality of photon beamlets 160 with enhanced properties in comparison to the incident photon beam 28. For example, the transmission plate 148 can be used to create a plurality of photon beamlets 160 with a higher intensity stability over time than the incident photon beam 28. Other embodiments of the plasmon generating photon transmission plate are also possible. Examples of suitable embodiments of plasmon-generating photon transmission plates 148 are described in U.S. Pat. No. 6,649,901 to Thio et al., issued Nov. 18, 2003; U.S. Pat. No. 6,236,033 to Ebbesen et al., issued May 22, 2001; and U.S. Pat. No. 5,973,316 to Ebbesen et al., issued Oct. 26, 1999; all three of which are herein incorporated by reference in their entireties.

Returning to FIG. 5, the plasmon-generating photon transmission plate 148 receives the photon beam 28 from a first lens 32a which focuses the photon beam 28 generated by the photon source 24. The transmission plate 148 generates a plurality of photon beamlets 160 emerging from the photon transmission apertures 156 which are incident on a second lens 32b. The plurality of photon beamlets 160 is then incident on the photocathode 36 after being focused by the second lens 32b. A plurality of electron beams 22 are generated by the photocathode 36 in response to the incident photon beamlets 160. The plurality of electron beams 22 are then shaped and modulated, including being turned on and off, by the array 80 of electron transmission gates 84, which are separated from the electron emitting surface 44 of the photocathode 36 by a distance $d_g$.

Figure 8:
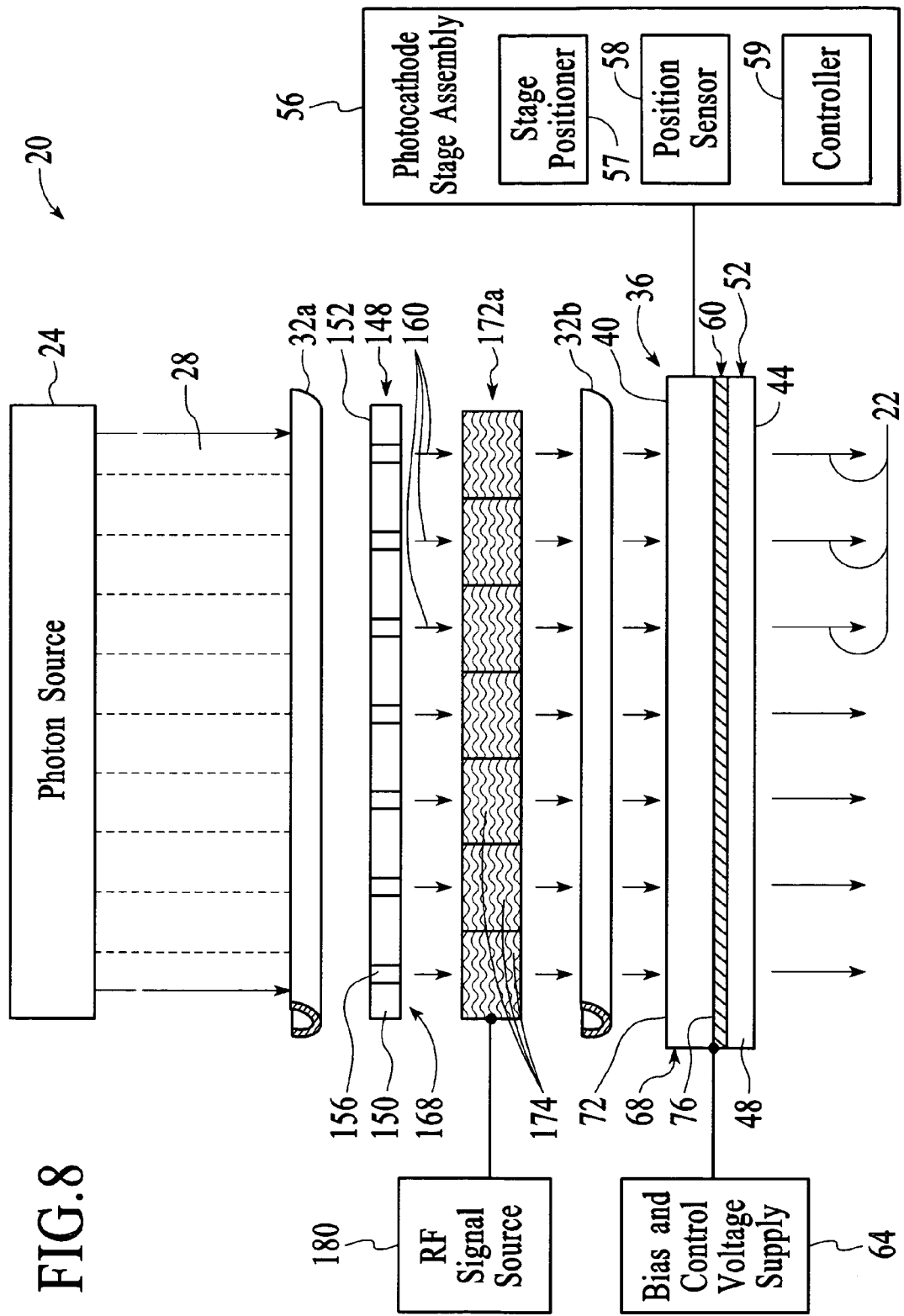
FIG. 8 is a sectional view of another embodiment of the multiple electron beam source.

Another embodiment of the multiple electron beam source 20, illustrated in FIG. 8, comprises a photon beam modulator 172 capable of individually modulating each photon beamlet 160 produced by the plasmon-generating photon transmission plate 148. Modulation of the photon beamlets 160 includes the turning on and off and the changing of intensity levels of the photon beamlets 160. Modulation of the photon beamlets 160 can accomplish modulation of the electron beams 22. For example, turning on or off an individual beamlet 160 can turn on or off the associated electron beam 22 that it generates. Changing the intensity of a photon beamlet 160 can change the intensity of an electron beam 22. Changing the intensity of an electron beam 22 is useful, for example, to partially expose pixels in a pattern, often referred to as gray level addressing of the pixel. Gray level addressing is useful to generate certain features in a pattern, such as rounded edges, or to tune the exposure of the pattern, such as the depth of exposure.

In the version illustrated in FIG. 8, the photon beam modulator 172 comprises an acousto-optic modulator 172a having an array of acousto-optic modulation elements 174. The acousto-optic modulation elements 174 modulate the photon beamlets 160 by acoustically diffracting the photon beamlets 160 in response to an RF signal from an RF signal source 180. Each photon beamlet is diffracted into a first order diffracted beam, which passes on to the photocathode, and higher order diffracted beams, which are blocked by an aperture (not shown). The acousto-optic modulation element can turn the photon beamlet on or off, or set the transmitted photon flux of the photon beamlet 160 to an intermediate value. In one embodiment, the array of acousto-optic modulator elements 174 comprises a plurality of elements of a number equal to the number of photon beamlets 160 produced by the plasmon-generating photon transmission plate 148. An advantage of using an acousto-optic modulator 172a is the high modulation rate achievable by such modulators.

In the embodiment shown in FIG. 8, the photon source 24 generates the photon beam 28 which is incident on the first lens 32a. The first lens 32a focuses the photon beam 28 on the plasmon-generating photon transmission plate 148 which generates the plurality of photon beamlets 160 emerging from the photon transmission apertures 156. The plurality of photon beamlets 160 are focused onto the photon beam modulator 172a, which may comprise an acousto-optic modulator 172a. The plurality of modulated photon beamlets 160 are incident on the second lens 32b which is capable of focusing the plurality of beamlets 160 onto the photocathode 36. The plurality of electron beams 22 are generated by the photocathode 36 in response to the incident photon beamlets 160. In this embodiment, the turning on and off each individual electron beam 22 is controlled by the turning on and off the corresponding photon beamlet 160 with the photon beam modulator 172.

Some embodiments of the multiple electron beam source 20 have a prism 176 and a photon beam modulator 172 comprising a spatial light modulator 172b. The spatial light modulator 172b is capable of producing photon beamlets 160 from an incident photon beam 28 and spatially modulating the photon beamlets 160. Modulation of the photon beamlets 160 can include the turning on and off and also changing the intensity of the photon beamlets 160. In one version, the spatial light modulator 172b comprises an array of movable mirrors 175. In other versions, the spatial light modulator 172b may comprise a micromechanical diffracting device, a cantilevered beam, or a continuous medium like an eidophor. The prism 176 is capable of selectively redirecting the photon beam 28 and photon beamlets 160 between components of the multiple electron beam source 20, such as between the photon source 24, spatial light modulator 172, lens 32, and photocathode 36. The prism 176 comprises photon transmissive materials with interfaces capable of selectively deflecting and reflecting photons. For example, the prism 176 may comprise a sapphire or quartz body with reflecting coatings.

Figure 9:
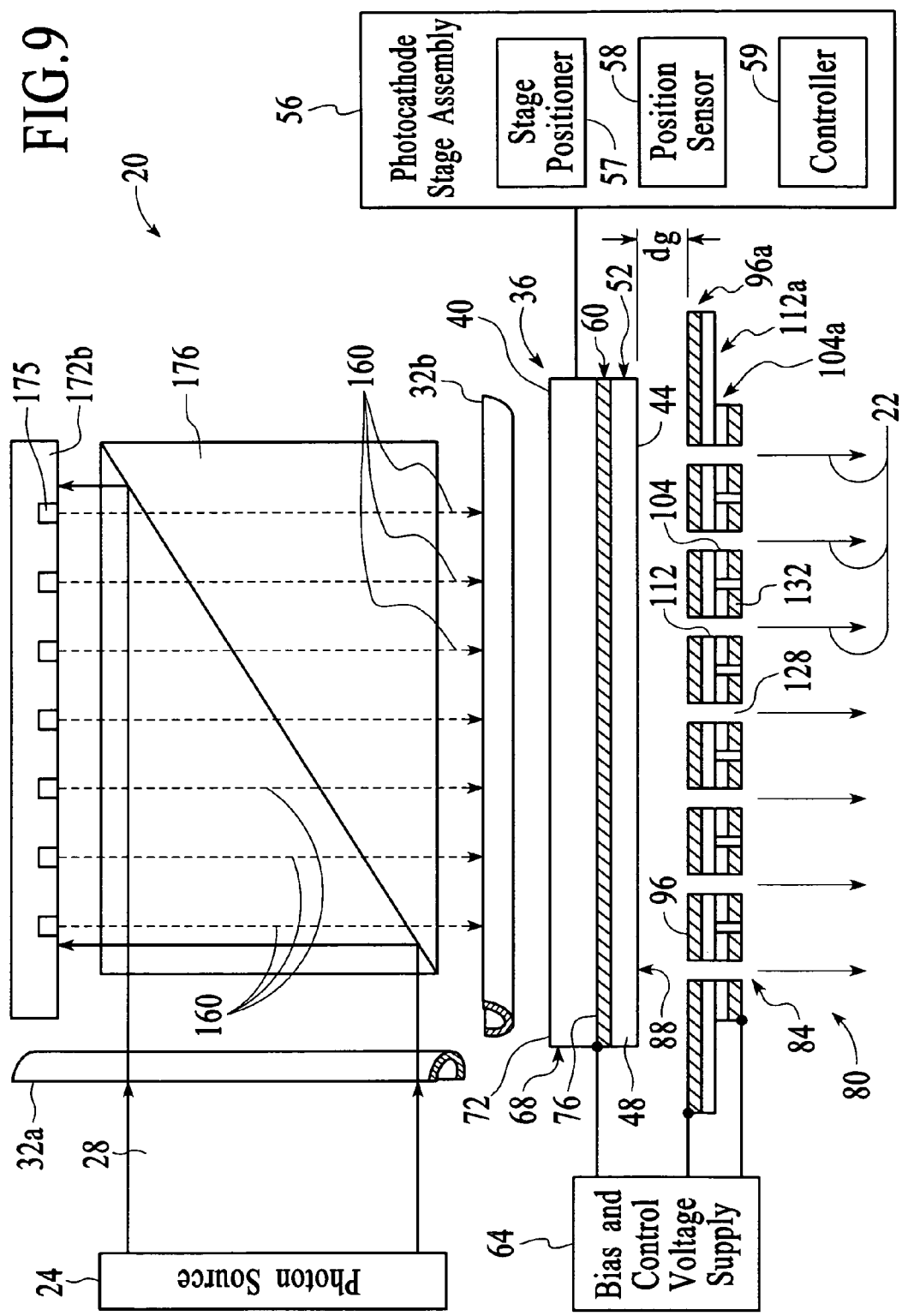
FIG. 9 is a sectional view of yet another embodiment of the multiple electron beam source.

In the embodiment illustrated in FIG. 9, the photon source 24 generates the photon beam 28 which is incident on the first lens 32a. The first lens 32a focuses the photon beam 28 through a prism 176 onto the photon beam modulator 172 which comprises a spatial light modulator 172b. In one version, the spatial light modulator 172b comprises an array of moveable mirrors 175. The photon beam modulator 172 is capable of creating and modulating a plurality of photon beamlets 160 from the photon beam 28 it receives from the prism 176. The plurality of modulated photon beamlets 160 are transmitted back through the prism 176 to the second lens 32b which is capable of focusing the plurality of beamlets 160 onto the photocathode 36. The plurality of electron beams 22 are generated by the photocathode 36 in response to the incident photon beamlets 160. This embodiment also comprises an array 80 of electron transmission gates 84 separated from the photocathode 36 by a separation distance $d_g$, which can also turn on and off individual electron beams 22. In this embodiment, modulation of each individual electron beam 22 can be accomplished by the electron transmission gates 84, or by modulating each individual photon beamlet 160 with the photon beam modulator 172.

Figure 10:
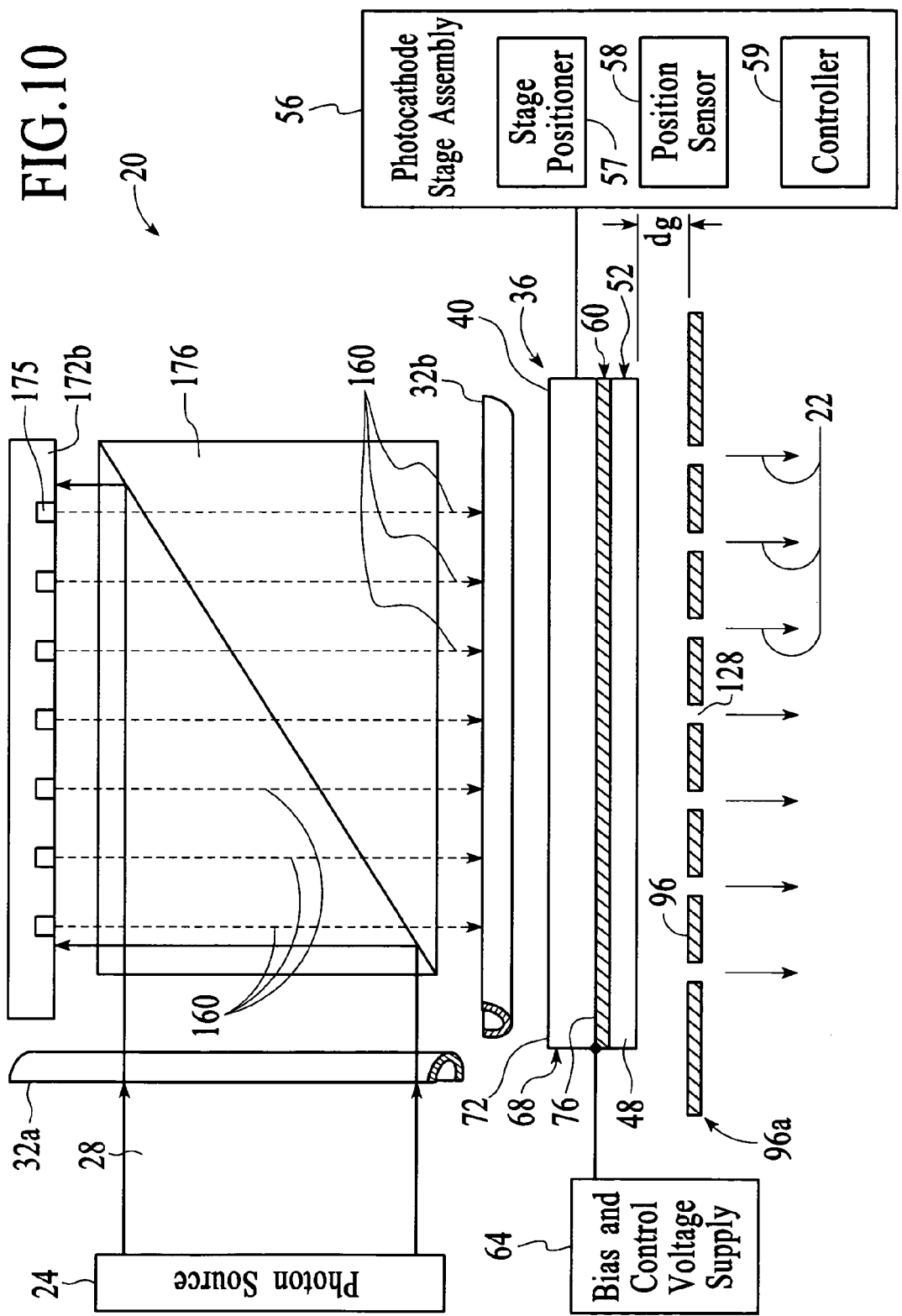
FIG. 10 is a sectional view of yet another embodiment of the multiple electron beam source.

In the embodiment shown in FIG. 10, the multiple electron beam source 20 is absent the array 80 of electron transmission gates 84 and instead has only anodes which determine the electron beam size. Individual electron beams 22 are modulated by the photon beam modulator 172. In this embodiment, the spatial light modulator 172b may produce photon beamlets 160 that do not precisely correspond to the desired size of the electron beams 22. This can be advantageous to reduce the cost and complexity required for the spatial light modulator 172b.

Figure 11:
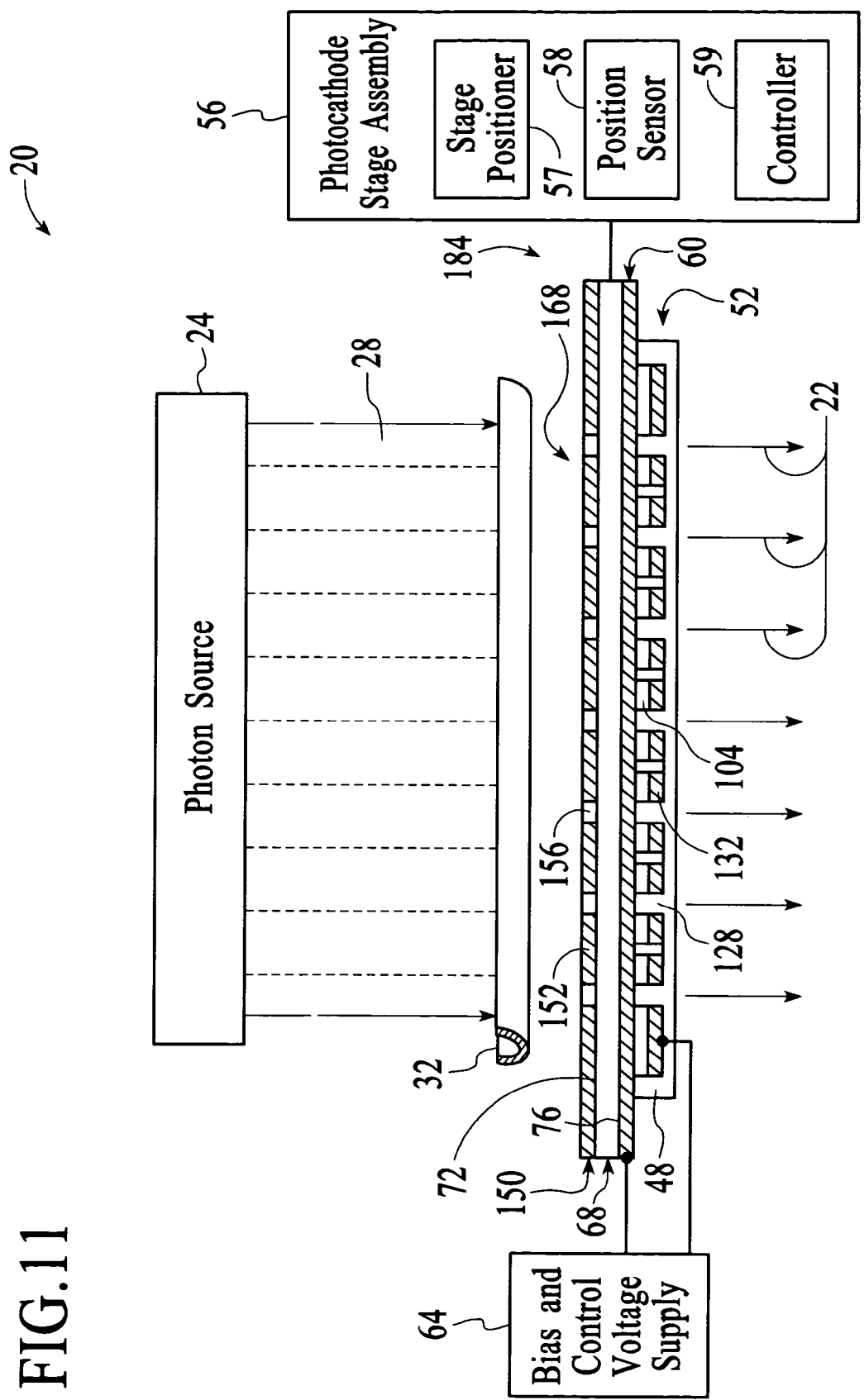
FIG. 11 is a sectional view of yet another embodiment of the multiple electron beam source.

Another embodiment of the multiple electron beam source 20, illustrated in FIG. 11, comprises a compact structure combining the plasmon generating photon transmission plate 148, the photocathode 36, and the array 80 of electron transmission gates 84. This compact structure, a gated photocathode 184, is advantageous because it is suitable for lithographic manufacturing processes which are accurate and capable of producing small features. Another advantage of this embodiment is that it is self-aligned and thus no alignment procedure is required between the plasmon generating transmission plate 148 and the array 80 of electron transmission gates 84. In addition, very low voltages can be used to switch low energy electrons generated by the photocathode 36 in this compact embodiment.

In one version, the gated photocathode 184 comprises the transmission layer 150 of the plasmon-generating photon transmission plate 148 formed on the first surface 72 of the substrate 68 facing the photon source 24. The conducting layer 60 is on the second surface 76 of the substrate 68, on the conducting layer 60 is the insulator 104, and on the insulator 104 is the gate electrode 132, together forming the array 80 of electron transmission gates 84. The electron emitting material 48 is formed about the array 80 of electron transmission gates 84. The electron emitting material 48 forms a photoemissive layer 52 about the insulator 104, gate electrode 132, and aperture 128 of the gate 84. In one version, the electron emitting material 48 completely covers the insulator 104 and gate electrode 132, and completely fills the aperture 128 of the gate 84. In another version, the electron emitting material 48 only partially covers the insulator 104 and gate electrode 132, and only partially fills the aperture 128 of the gate 84.

Figure 12:
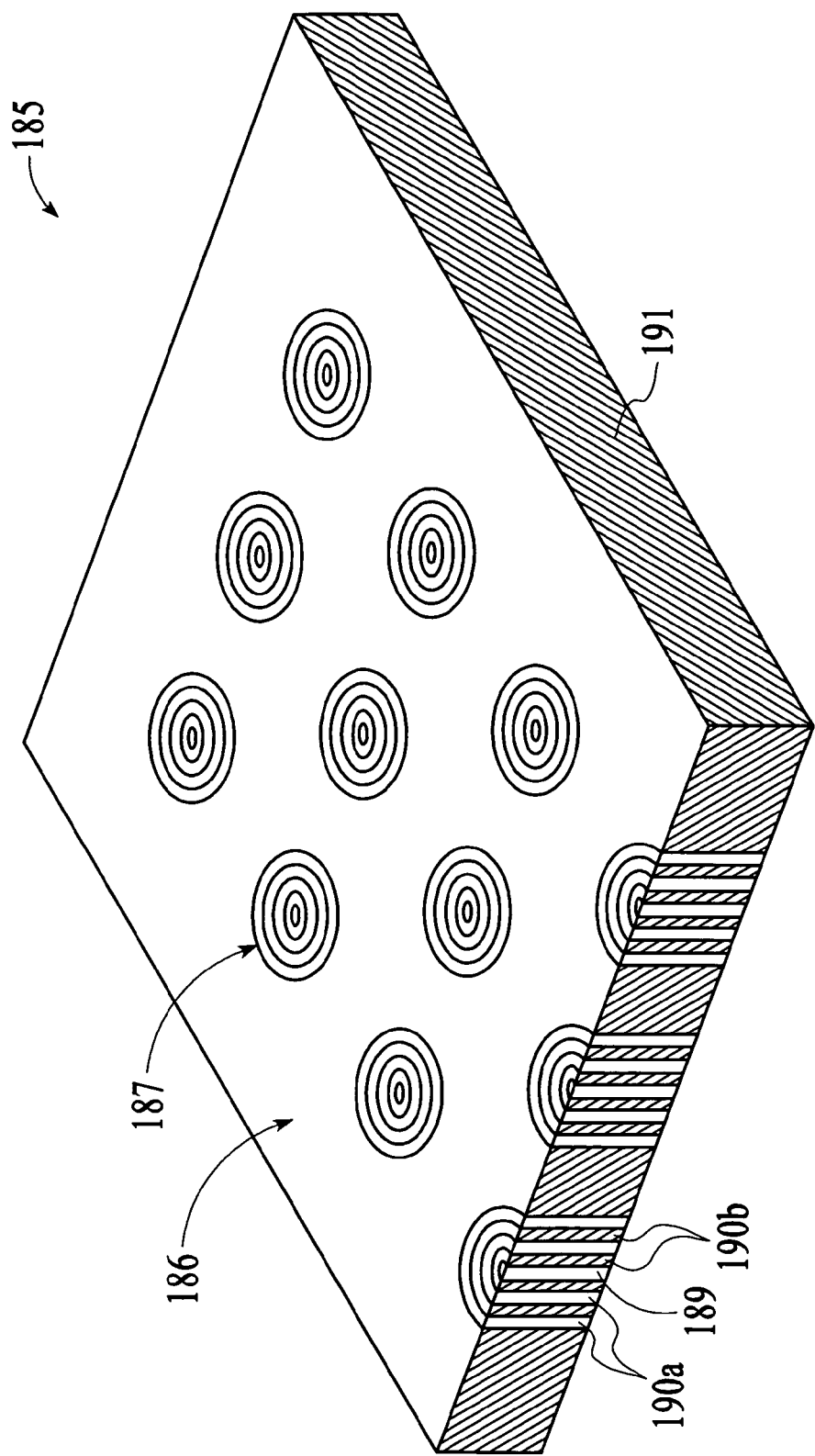
FIG. 12 is a perspective view of an embodiment of a zone plate.

In another embodiment of the multiple electron beam source 20, the plasmon generating photon transmission plate 148 can be replaced with a zone plate 185. An exemplary embodiment of a suitable zone plate 185 is illustrated in FIG. 12. The zone plate 185 has a similar function to the plasmon generating transmission plate 148. The zone plate 185 is capable of focusing, altering, and enhancing the transmission of photons through the zone plate 185. The zone plate 185 comprises an array 186 of zone plate elements 187 in a zone plate layer 191 through which photons are transmitted. The zone plate elements 187 work together to create constructive interference of the photons passing through the elements 187.

Each zone plate element 187 comprises a central zone aperture 189 surrounded by a plurality of concentric zone rings 190. The diameters of the concentric zone rings 190 increase as a function of the square of a natural number, such that the areas of the concentric zone rings 190 are equal. The second ring 190 surrounding the zone aperture 189, as well as successively alternating rings 190, are transmission zone rings 190a. The first ring 190 surrounding the zone aperture 189, as well as successively alternating rings 190, are secondary zone rings 190b.

The central aperture 189 and the tranmission zone rings 190a are transparent to photons incident on the zone plate 185. In one version, the rest of the zone plate layer 191, as well as the secondary zone rings 190b, are opaque to the incident photons. In this version, the photons transmitted through the zone aperture 189 and the tranmission zone rings 190a constructively interfere to create a focused region of photon incidence 170 on the photocathode. In another version, the secondary zone rings 190b are not opaque, but instead change the phase of the transmitted photons, for example, by 180 degrees. This is known as a half wave zone plate. In this version, the photons transmitted through the zone aperture 189, the transmission zone rings 190a, and the secondary zone rings 190b, all constructively interfere to create a focused region of photon incidence 170. The advantage of this second configuration is that it more efficiently uses the photons incident on the zone plate 185, as the photons incident on the secondary zone rings 190b are not wasted.

The zone plate 185 can comprise a variety of materials. The opaque portions of the zone plate 185, including the portion of the zone plate layer 191 other than the zone plate elements 187 and the opaque version of the secondary zone rings 190b, comprise an opaque material such as a metal, for example, aluminum, gold or chromium, or another material opaque to the photons incident on the zone plate 185. The transparent portion of the zone plate 185, including the central zone aperture 189, as well as the transmission zone rings 190a, may comprise a transparent material or no material at all. In one version, the zone plate 185 may comprise the zone plate layer 191 formed on a transparent substrate. In this version, the zone plate layer 191 comprises an opaque material to form the opaque portions of the zone plate 185 and no material to form the transparent portions. In the half wave zone plate configuration, the zone plate 185 may have secondary zone rings 190b that comprise a suitable transparent material that imparts the desired phase change of the transmitted photons. The secondary zone rings 190b may also be formed to have varying depths to achieve the phase change.

In one version, the array 186 of zone elements 187 is aligned with the array 80 of electron transmission gates 84. In this version, each zone element 187 corresponds with and is aligned to an electron transmission gate 84. For example, the zone element 187 can be positioned directly above the electron transmission gate 84. In this version, zone element 187 can be designed to select the size of the region of photon incidence. For example, in one embodiment, the region of photon incidence 170 can be selected to be about 150% to about 200% of the size of the electron transmission gate aperture 128. Thus, the electron emitting material 48 corresponding to the region of photon incidence 170 receives a concentration of photons to ensure efficient electron generation, but avoid excessive heating of the photocathode 36.

Examples of suitable embodiments of a zone plate are described in U.S. Pat. No. 3,704,377 to Lehovec, issued Nov. 28, 1972; U.S. Pat. No. 6,166,854 to Katsuma, issued Dec. 26, 2000; and U.S. Pat. No. 6,167,016 to Block et al., issued Dec. 26, 2000; all three of which are herein incorporated by reference in their entireties.

Figure 13:
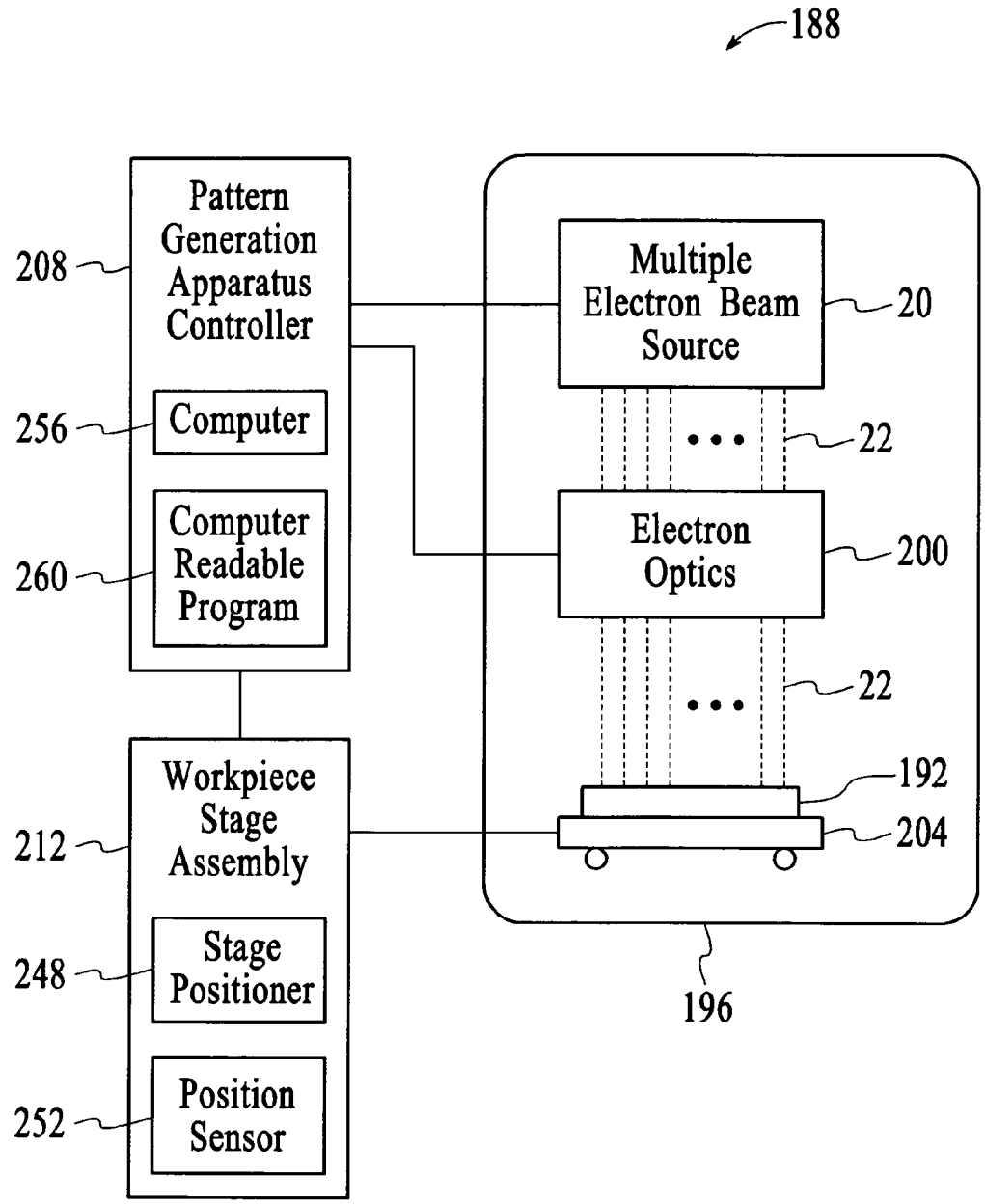
FIG. 13 is a schematic view of an embodiment of an electron beam pattern generator.

The multiple electron beam source 20 can be used in an electron beam pattern generation apparatus 188, an exemplary embodiment of which is illustrated schematically in FIG. 13. The apparatus 188 is capable of scanning multiple electron beams 22 across a workpiece 192 to generate a pattern on the workpiece. The workpiece 192 can be a blank mask; a silicon wafer; a compound semiconductor wafer; a printed circuit board; or a multichip module. For example, the electron beam pattern generation apparatus 188 can be used to produce a mask useful in the fabrication of integrated circuits. In this embodiment, the workpiece 192 comprises a glass or quartz substrate with an electron-sensitive resist coating. After exposing the workpiece 192 to electron beams 22, the exposed resist layer is developed to form the mask. The embodiments of the pattern generation apparatus 188 and workpiece 192 illustrated herein are examples, and should not be used to limit the scope of the invention, and the invention encompasses equivalent or alternative versions, as would be apparent to one of ordinary skill in the art.

The electron beam pattern generation apparatus 188 comprises enclosing walls 196 capable of containing a vacuum environment in which electron beams 22 can be generated and manipulated. The enclosing walls 196 are substantially vacuum tight and are typically made of a material such as aluminum or non-magnetic stainless steel. One or more vacuum pumps (not shown) are provided to evacuate the vacuum column to create and maintain the vacuum environment. The enclosing walls 196 may contain entirely, or selected portions of the pattern generation apparatus which comprises the multiple electron beam source 20, electron optics 200, a workpiece support 204, the workpiece 192, a pattern generation apparatus controller 208, and a workpiece stage assembly 212.

Figure 14:
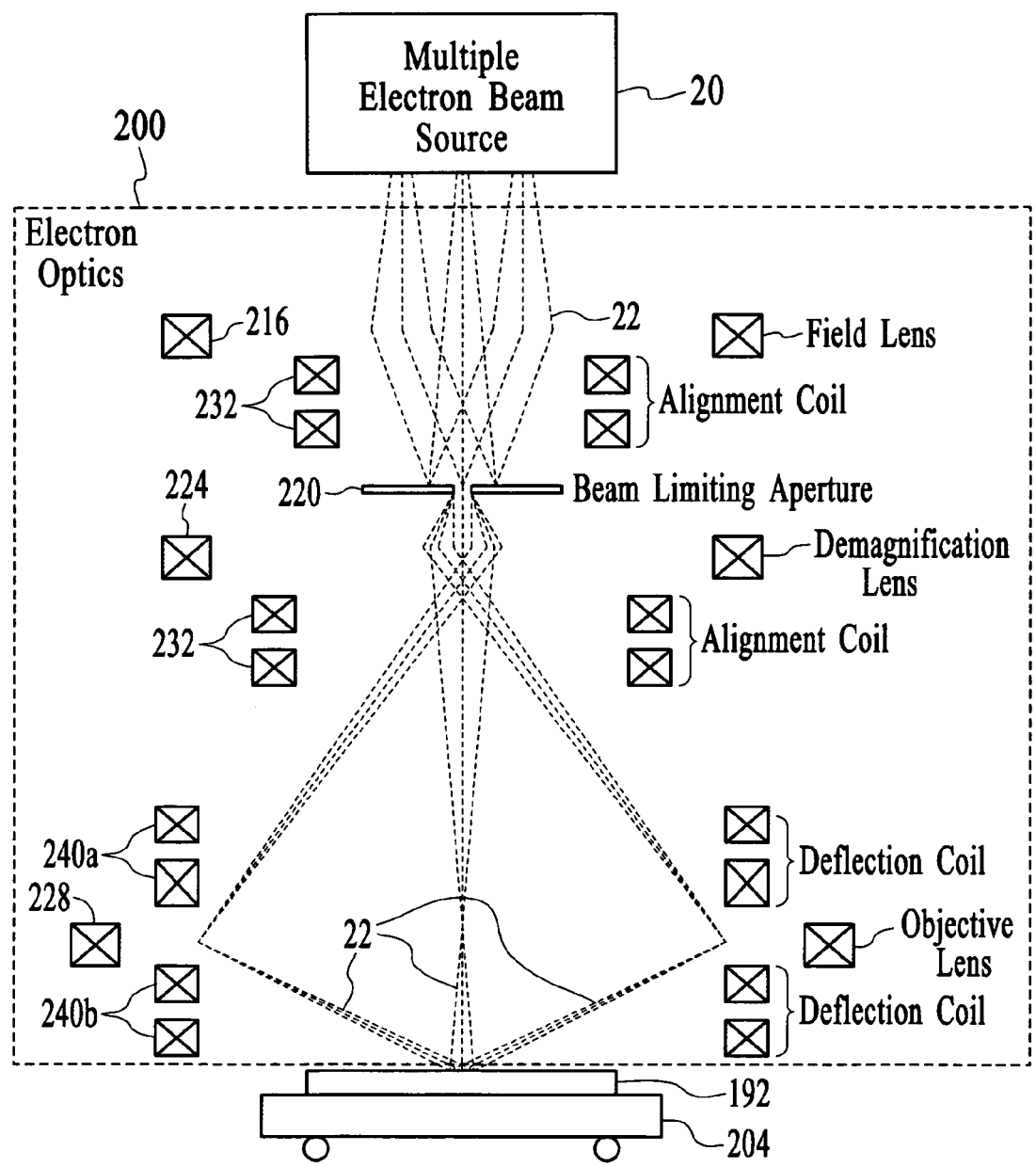
FIG. 14 is a schematic view of an embodiment of electron optics for the electron beam pattern generator of FIG. 11.

The electron optics 200, illustrated schematically in FIG. 14, comprise components to focus, demagnify, stigmate, or align the multiple electron beams 22. The electron optics 200 may comprise, for example, an electron field lens 216 near the multiple electron beam source 20 capable of collimating the electrons exiting the multiple electron beam source 20 and forming a crossover in the plane of a beam-limiting aperture 220. A virtual image created by the field lens 216 is then subsequently demagnified by the demagnification 224 and objective magnetic lenses 228. Off-axis aberrations in the demagnification lenses 224 are reduced by the electron field lens 216. Sets of alignment coils 232 are used to center and stigmate the electron beams in the beam-limiting aperture 220 and in the objective lens 228. In one version, the electron optics 200 also comprise a beam scanner 236 comprising a set of magnetic beam deflection coils 240a to scan the array of individually modulated electron beams 22 across the workpiece 192. Another set of magnetic deflection coils 240b performs dynamic stigmation and focus as the electron beam array is scanned across a field of the workpiece 192. This allows dynamic stigmation, focus, or x/y deflection corrections to be applied to different parts of the scan field. The electron beam pathway traversed by the multiple electron beams 22 can be along a straight pathway, a curved pathway, or a series of redirected pathways. Thus, the components of the electron optics 200 may be vertically oriented in a column above the workpiece 192, or oriented in an angled configuration (not shown), such as a right-angled configuration, or may be oriented in a curved configuration (also not shown).

In one version, the electron optics 200 place the photocathode 36 in a uniform magnetic field. Placing the photocathode 36 in a uniform magnetic field helps create an individual crossover point for each electron beam 22 generated by the multiple electron beam source 20. The crossover point is where the electron beams 22 converge spatially to accomplish magnification or demagnification of the electron beams 22. Individual crossover points are advantageous because they limits space charge effects that occur when multiple electron beams 22 are forced to converge together. Space charge effects result from repulsive interactions between electrons. Space charge effects can result in blurring and defocusing of electron beams, undesirably reducing the quality of the pattern generated. Individual crossover points reduce space charge effects because they spatially distribute the crossover points of each electron beam 22, reducing the number electrons present at each crossover point. Individual cross over points also reduce beam placement errors.

The electron beam pattern generation apparatus 188 further comprises a workpiece support 204. The support 204 may comprise an electrostatic chuck (not shown) capable of holding the workpiece 192 against the support 204. The electron beam pattern generation apparatus 188 may also comprise a workpiece stage assembly 212 capable of moving the support 204 to precisely position the workpiece 192 in relation to the electron optics 200 or to scan the electron beams 22 across the workpiece 192. For example, in one version, the workpiece stage assembly 212 comprises a workpiece stage positioner 248 and a workpiece position sensor 252. The workpiece stage positioner 248 may comprise electric motors that translate the support 204 in the x and y directions along an x-y plane parallel to the workpiece surface, or rotate, elevate or lower, or tilt the support 204. The workpiece position sensor 252 is capable of precisely determining the position of the workpiece 192 and workpiece support 204. For example, the workpiece position sensor 252 may comprise an interferometer that reflects a light beam (not shown) from the support 204 and detects the intensity of the reflected beam. In this version, the workpiece position sensor 252 uses interferometric analysis to determine the position of the workpiece support 204 and the workpiece 192. The workpiece position sensor 252 may comprise a plurality of sensors to determine the position of the workpiece 192 or workpiece support 204 by sensing a plurality of locations on the workpiece 192 or workpiece support 204.

The electron beam pattern generation apparatus 188 further comprises a pattern generation apparatus controller 208 comprising a suitable configuration of hardware and software to operate the components of the electron beam pattern generation apparatus 188 to generate an electron beam pattern on the workpiece 192. For example, in one version, the pattern generation apparatus controller 208 comprises a computer 256 and a computer-readable program 260. In one embodiment of this version, the computer 256 comprises a central processing unit that is connected to a memory and other components. The central processing unit comprises a microprocessor, capable of executing a computer-readable program 260. The memory may comprise a computer-readable medium such as hard disks, removable storage, random access memory, and/or other types of memory. The interface between a human operator and the pattern generation apparatus controller 208 can be, for example, via a display, and an input device, such as a keyboard. The pattern generation apparatus controller 208 may also include drive electronics such as analog and digital input/output boards, linear motor driver boards, or stepper motor controller boards.

One way in which the intensity of an individual electron beam 22 can be modulated is by modulating the intensity of the photon beam 28 incident on the photon receiving surface 40 of the photocathode 36. Modulating the intensity of the electron beam 22 is one way to partially expose a pixel in a pattern with the electron beam 22, otherwise known as gray level addressing. For example, the photon source 24 is capable of generating a photon beam 28 comprising a pulse of photons over time. This pulse of photons generates a pulse of electrons from the electron transmission gate 84, which in turn can be used in the pattern generation apparatus 188 to expose an electron sensitive resist layer to form a pattern. Modulating the photon beam pulse width, in other words, the time duration of the pulse, can modulate the electron beam pulse width, and thus the time of exposure of the resist to electrons, which determines the extent to which the resist is exposed.

The computer-readable program 260 generally comprises software comprising sets of instructions to operate the apparatus components. The computer-readable program 260 may include instruction sets to, for example, control the positioning of the workpiece support 204, locate fiducial marks on the workpiece 192, control beam modulation, control data compression, and control the retarding of the electron beams 22. The instruction sets may receive parameters, such as a data file corresponding to the support position, the fiducial mark locations, the electron beam pattern, properties of the workpiece 192, or instructions entered by the human operator.

The pattern generation apparatus controller 208 is adapted to generate, send, and receive signals to operate the electron beam pattern generation apparatus 188 to generate a pattern by directing electron beams 22 onto the workpiece 192. For example, the pattern generation apparatus controller 208 may send signals to the multiple electron beam source 20 to control modulation of the electron beams 22 to the desired intensity levels, such as in correspondence to electron beam pattern data to write a corresponding pattern on the workpiece 192. The electron optics 200 may also be controlled to scan the electron beam pattern in the scanning direction by timing electron beam pulses, and the workpiece stage positioner 248 may also receive real-time instructions from the pattern generation apparatus controller 208 to control the position of the workpiece 192 to scale, rotate, or offset the pattern generated by the electron beams 22. The pattern generation apparatus controller 208 may also coordinate communication between components of the electron beam pattern gernation apparatus 188, such as between the electron optics 200 and the workpiece position sensor 252.

The present invention has been described with reference to certain preferred versions thereof; however, other versions are possible. For example, the apparatus may be used for mask or pattern inspection for substrates such as wafers or LCD panels, and in other types of applications as would be apparent to one of ordinary skill. Therefore, the spirit and scope of the appended claims should not be limited to the description of the preferred versions contained herein.

What is claimed is:

1. A multiple electron beam source comprising:
    (a) a photocathode comprising a photon receiving surface to receive a photon beam and an electron emitting surface to emit electrons; and
    (b) an array of electron transmission gates having a surface facing the electron emitting surface of the photocathode, the surface of the array of electron transmission gates spaced apart from the electron emitting surface of the photocathode by a separation distance $d_g$, each electron transmission gate comprising:
        (i) a membrane having opposing first and second surfaces;
        (ii) an anode on the first surface of the membrane;
        (iii) an insulator on the second surface of the membrane;
        (iv) an aperture through the anode, insulator and membrane; and
        (v) a gate electrode on the insulator, the gate electrode positioned about the aperture, the gate electrode capable of receiving a gate control voltage that controls the transmission of electrons emitted from the photocathode through that electron transmission gate.

2. A multiple electron beam source according to claim 1 comprising a photocathode stage assembly to move the photocathode relative to the array of electron transmission gates.

3. A multiple electron beam source according to claim 2 wherein the photocathode stage assembly comprises a flexure, a piezoelectric actuator and a position sensor.

4. A multiple electron beam source according to claim 1 wherein the array of electron transmission gates has periodic spacing in two dimensions.

5. A multiple electron beam source according to claim 1 wherein the gate electrode comprises gate electrode segments which are independently electrically addressable.

6. A multiple electron beam source according to claim 1 wherein the separation distance $d_g$ is from about 10 μm to about 100 μm.

7. A multiple electron beam source according to claim 1 comprising a photon source to generate the photon beam.

8. A multiple electron beam source according to claim 1 comprising a lens to focus the photon beam.

9. A multiple electron beam source according to claim 1 wherein the membrane comprises silicon, silicon nitride, silicon carbide, diamond, boron nitride, or mixtures thereof; and the insulator comprises silicon oxide, a ceramic, an organic material, or mixtures thereof.

10. A multiple electron beam source comprising:
    (a) a plasmon-generating photon transmission plate capable of receiving a photon beam, the plasmon-generating photon transmission plate comprising an array of photon transmission apertures to transmit a plurality of photon beamlets and exterior surfaces capable of supporting plasmons;
    (b) a photocathode comprising a photon receiving surface to receive the plurality of photon beamlets and an electron emitting surface to emit electrons; and
    (c) an array of electron transmission gates having a surface facing the electron emitting surface of the photocathode, the surface of the array of electron transmission gates separated from the electron emitting surface of the photocathode by a separation distance $d_g$, and each electron transmission gate capable of receiving a gate control voltage that controls the transmission of electrons emitted from the photocathode through that electron transmission gate.

11. A multiple electron beam source according to claim 10 wherein the plasmon-generating photon transmission plate has one or more spatial gratings, each spatial grating comprising a plurality of grooves concentric to a single photon transmission aperture.

12. A multiple electron beam source according to claim 10 wherein the plasmon-generating photon transmission plate comprises a transmission layer formed on a substrate, the transmission layer having the photon transmission apertures.

13. A multiple electron beam source according to claim 10 wherein each photon transmission aperture has a principal dimension $d_0$ which is about less than or equal to the wavelength $\lambda_0$ of the photon beam.

14. A multiple electron beam source according to claim 10 wherein the array of photon transmission apertures has periodic spacing in two dimensions, the period $p_0$ of the spacing being equal in both dimensions.

15. A multiple electron beam source according to claim 10 wherein each electron transmission gate comprises:
 (a) a membrane having opposing first and second surfaces;
 (b) an anode on the first surface of the membrane;
 (c) an insulator on the second surface of the membrane;
 (d) an aperture through the anode, insulator and membrane; and
 (e) a gate electrode on the insulator, the gate electrode positioned about the aperture, the gate electrode capable of receiving the gate control voltage.

16. A multiple electron beam source according to claim 10 comprising a photocathode stage assembly to move the photocathode relative to the array of electron transmission gates.

17. A multiple electron beam source according to claim 16 wherein the photocathode stage assembly comprises a flexure, a piezoelectric actuator and a position sensor.

18. A multiple electron beam source according to claim 10 comprising a photon source to generate the photon beam.

19. A multiple electron beam source according to claim 10 comprising a first lens to focus the photon beam onto the plasmon-generating photon transmission plate and a second lens to focus the plurality of photon beamlets transmitted from the plasmon generating photon transmission plate onto the photocathode.

20. A multiple electron beam source comprising:
 (a) a plasmon-generating photon transmission plate capable of receiving a photon beam, the plasmon-generating photon transmission plate comprising an array of photon transmission apertures to transmit a plurality of photon beamlets and exterior surfaces capable of supporting plasmons;
 (b) an photon beam modulator capable of individually blanking each photon beamlet in the plurality of photon beamlets;
 (c) a photocathode comprising a photon receiving surface and an electron emitting surface, the photon receiving surface capable of receiving the plurality of photon beamlets; and
 (d) an array of electron transmission gates having a surface facing the electron emitting surface of the photocathode, the surface of the array of electron transmission gates spaced apart from the electron emitting surface of the photocathode by a separation distance $d_g$, and each gate being aligned with a photo transmission aperture.

21. A multiple electron beam source according to claim 20 wherein the photon beam modulator is an acousto-optic modulator.

22. A multiple electron beam source according to claim 20 wherein the plasmon-generating photon transmission plate has one or more spatial gratings, each spatial grating comprising a plurality of grooves concentric to a single photon transmission aperture.

23. A multiple electron beam source according to claim 20 comprising a photon source to generate a photon beam.

24. A multiple electron beam source according to claim 20 comprising a first lens to focus the photon beam onto the plasmon-generating photon transmission plate and a second lens capable of receiving and focusing the plurality of photon beamlets from the photon beam modulator onto the photocathode.

25. A multiple electron beam source comprising:
 (a) a photocathode comprising a photon receiving surface and an electron emitting surface, the photon receiving surface capable of receiving a photon beam;
 (b) a plurality of arrays of electron transmission gates on the photocathode, each gate within each array having an associated gate in each of the other arrays, each electron transmission gate comprising:
  (i) an insulator on the electron emitting surface of the photocathode;
  (ii) an aperture through the insulator; and
  (iii) a gate electrode on the insulator, the gate electrode positioned about the aperture, the gate electrode capable of receiving a gate control voltage that controls the transmission of electrons from the photocathode through that electron transmission gate;
 (c) a single conducting lead electrically connecting the gate electrodes of associated gates to allow simultaneous control, with a single gate control voltage, of the transmission of electrons through associated gates; and
 (d) a controller comprising gate array switching capability to switch the functionality from one gate array to another gate array without switching control voltages.

26. A multiple electron beam source according to claim 25 comprising a photocathode stage assembly to move the photocathode relative to the photon source.

27. A multiple electron beam source according to claim 26 wherein the photocathode stage assembly comprises a flexure, a piezoelectric actuator and a position sensor.

28. A multiple electron beam source according to claim 25 comprising a photon source to generate the photon beam.

29. A multiple electron beam source according to claim 25 comprising a lens to focus the photon beam.

30. A gated photocathode comprising:
 (a) a substrate having opposing first and second surfaces;
 (b) a photon transmission layer on the first substrate surface comprising a photon receiving surface to receive a photon beam and an array of photon transmission apertures, the photon receiving surface comprising a plasmon-generating photon transmission layer having a spatial grating comprising a plurality of grooves concentric to a single photon transmission aperture;
 (c) a conducting layer on the second substrate surface;
 (d) an insulating layer on the conducting layer having an array of electron transmission apertures, each electron transmission aperture aligned with a photon transmission aperture;
 (e) a gate layer on the insulating layer comprising an array of gate electrodes, each gate electrode positioned about an electron transmission aperture and capable of receiving a gate control voltage; and
 (f) a photoemissive layer about the insulating layer and gate layer and at least partially extending into each electron transmission aperture, the photoemissive layer capable of emitting electrons and wherein emission of electrons from the photoemissive layer in each electron transmission gate is controlled by the gate control voltage.

31. A gated photocathode according to claim 30 wherein the photon transmission layer is a plasmon-generating photon transmission layer having surfaces capable of supporting plasmons.

32. A multiple electron beam source comprising the gated plasmon-generating photocathode of claim 30, a photon source to generate a photon beam, and a lens capable of focusing the photon beam onto the photon receiving surface.

33. A multiple electron beam source comprising:
- (a) a prism capable of receiving and transmitting a photon beam;
- (b) a photon beam modulator to modulate the photon beam transmitted by the prism and reflect a plurality of photon beamlets;
- (c) a photocathode comprising a photon receiving surface to receive the plurality of photon beamlets and an electron emitting surface to emit electrons; and
- (d) an array of electron transmission gates having a surface facing the electron emitting surface of the photocathode, the surface of the array of electron transmission gates spaced apart from the electron emitting surface and separated from the electron emitting surface by a separation distance $d_g$, each electron transmission gate capable of receiving a gate control voltage that controls the transmission of electrons from the electron emitting surface through that electron transmission gate.

34. A multiple electron beam source according to claim 33 wherein the photon beam modulator comprises a spatial light modulator.

35. A multiple electron beam source according to claim 34 wherein the spatial light modulator comprises an array of movable mirrors.

36. A multiple electron beam source according to claim 33 wherein each electron transmission gate comprises:

- (a) a membrane having opposing first and second surfaces;
- (b) an anode on the first surface of the membrane;
- (c) an insulator on the second surface of the membrane;
- (d) an aperture through the anode, insulator and membrane; and
- (e) a gate electrode on the insulator, the gate electrode positioned about the aperture, the gate electrode capable of receiving the gate control voltage.

37. A multiple electron beam source according to claim 33 comprising a photocathode stage assembly to move the photocathode relative to a photon source that generates the photon beam.

38. A multiple electron beam source according to claim 37 wherein the photocathode stage assembly comprises a flexure, a piezoelectric actuator and a position sensor.

39. A multiple electron beam source according to claim 33 comprising a photon source to generate a photon beam.

40. A multiple electron beam source according to claim 34 comprising a first lens to focus the photon beam and a second lens to focus the plurality of photon beamlets reflected by the spatial light modulator.

* * * * *